(12) United States Patent
Fukuzawa et al.

(10) Patent No.: US 8,048,492 B2
(45) Date of Patent: Nov. 1, 2011

(54) MAGNETORESISTIVE EFFECT ELEMENT AND MANUFACTURING METHOD THEREOF

(75) Inventors: Hideaki Fukuzawa, Kawasaki (JP); Hiromi Yuasa, Kawasaki (JP); Yoshihiko Fuji, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 12/086,761

(22) PCT Filed: Dec. 20, 2006

(86) PCT No.: PCT/JP2006/325995
§ 371 (c)(1),
(2), (4) Date: Jun. 19, 2008

(87) PCT Pub. No.: WO2007/072987
PCT Pub. Date: Jun. 28, 2007

(65) Prior Publication Data
US 2009/0162698 A1    Jun. 25, 2009

(30) Foreign Application Priority Data
Dec. 21, 2005  (JP) ................ 2005-368463

(51) Int. Cl.
*B05D 3/02* (2006.01)
*B05D 3/06* (2006.01)
*H05H 1/24* (2006.01)
*H05H 1/26* (2006.01)
*C23C 14/58* (2006.01)
*H05H 1/10* (2006.01)
*C23C 14/34* (2006.01)

(52) U.S. Cl. ........ 427/532; 427/533; 427/535; 427/528; 427/548; 427/130; 427/131; 427/132; 204/192.2; 204/192.15; 204/192.17

(58) Field of Classification Search ................ None
See application file for complete search history.

(56) References Cited

U.S. PATENT DOCUMENTS

| | | |
|---|---|---|
| 5,304,975 A | 4/1994 | Saito et al. |
| 5,313,186 A | 5/1994 | Schuhl et al. |
| 5,448,515 A | 9/1995 | Fukami et al. |
| 5,459,687 A | 10/1995 | Sakakima et al. |
| 5,549,978 A | 8/1996 | Iwasaki et al. |
| 5,668,688 A | 9/1997 | Dykes et al. |

(Continued)

FOREIGN PATENT DOCUMENTS

CN    1431651    7/2003

(Continued)

OTHER PUBLICATIONS

Takagishi, M. et al., "The Applicability of CPP-GMR Heads for Magnetic Recording", IEEE Transactions on Magnetics, vol. 38, No. 5, pp. 2277-2282, (Sep. 2002).

(Continued)

*Primary Examiner* — Marianne L Padgett
(74) *Attorney, Agent, or Firm* — Nixon & Vanderhye P.C.

(57) ABSTRACT

A magnetoresistive effect element is produced by forming a first magnetic layer, a spacer layer including an insulating layer and a conductive layer which penetrates through the insulating layer and passes a current, on the first magnetic layer, and a second magnetic layer all of which or part of which is treated with ion, plasma or heat, on the formed spacer layer.

18 Claims, 9 Drawing Sheets

U.S. PATENT DOCUMENTS

| Patent No. | | Date | Inventor(s) | Ref |
|---|---|---|---|---|
| 5,715,121 | A | 2/1998 | Sakakima et al. | |
| 5,768,181 | A | 6/1998 | Zhu et al. | |
| 5,768,183 | A | 6/1998 | Zhu et al. | |
| 5,777,542 | A | 7/1998 | Ohsawa et al. | |
| 5,900,324 | A * | 5/1999 | Moroishi et al. | 428/611 |
| 5,923,504 | A * | 7/1999 | Araki et al. | 360/324.11 |
| 5,936,402 | A | 8/1999 | Schep et al. | |
| 5,949,622 | A * | 9/1999 | Kamiguchi et al. | 360/324.12 |
| 5,962,080 | A | 10/1999 | Tan et al. | |
| 6,002,553 | A | 12/1999 | Stearns et al. | |
| 6,013,365 | A | 1/2000 | Dieny et al. | |
| 6,016,241 | A | 1/2000 | Coffey et al. | |
| 6,033,584 | A | 3/2000 | Ngo et al. | |
| 6,074,743 | A | 6/2000 | Araki et al. | |
| 6,096,434 | A | 8/2000 | Yano et al. | |
| 6,114,056 | A | 9/2000 | Inomata et al. | |
| 6,117,569 | A * | 9/2000 | Lin et al. | 428/811.2 |
| 6,127,045 | A * | 10/2000 | Gill | 428/611 |
| 6,132,892 | A | 10/2000 | Yoshikawa et al. | |
| 6,159,593 | A | 12/2000 | Iwasaki et al. | |
| 6,205,008 | B1 | 3/2001 | Gijs et al. | |
| 6,219,275 | B1 | 4/2001 | Nishimura | |
| 6,275,363 | B1 | 8/2001 | Gill | |
| 6,303,218 | B1 | 10/2001 | Kamiguchi et al. | |
| 6,313,973 | B1 * | 11/2001 | Fuke et al. | 360/324.1 |
| 6,330,137 | B1 | 12/2001 | Knapp et al. | |
| 6,340,533 | B1 | 1/2002 | Ueno et al. | |
| 6,348,274 | B1 | 2/2002 | Kamiguchi et al. | |
| 6,353,318 | B1 | 3/2002 | Sin et al. | |
| 6,368,706 | B1 * | 4/2002 | Iwasaki et al. | 428/332 |
| 6,400,537 | B2 | 6/2002 | Sakakima et al. | |
| 6,452,763 | B1 | 9/2002 | Gill | |
| 6,469,926 | B1 | 10/2002 | Chen | |
| 6,473,275 | B1 | 10/2002 | Gill | |
| 6,495,275 | B2 * | 12/2002 | Kamiguchi et al. | 360/324.11 |
| 6,517,896 | B1 | 2/2003 | Horng et al. | |
| 6,519,123 | B1 | 2/2003 | Sugawara et al. | |
| 6,522,507 | B1 | 2/2003 | Horng et al. | |
| 6,556,390 | B1 | 4/2003 | Mao et al. | |
| 6,567,246 | B1 | 5/2003 | Sakakima et al. | |
| 6,603,642 | B1 | 8/2003 | Arki et al. | |
| 6,636,391 | B2 | 10/2003 | Watanabe et al. | |
| 6,674,615 | B2 | 1/2004 | Hayashi | |
| 6,686,068 | B2 | 2/2004 | Carey et al. | |
| 6,690,163 | B1 | 2/2004 | Hoshiya et al. | |
| 6,710,984 | B1 * | 3/2004 | Yuasa et al. | 360/324.11 |
| 6,720,036 | B2 | 4/2004 | Tsunekawa et al. | |
| 6,759,120 | B2 | 7/2004 | Jangill et al. | |
| 6,767,655 | B2 | 7/2004 | Hiramoto et al. | |
| 6,770,382 | B1 | 8/2004 | Chang et al. | |
| 6,853,520 | B2 * | 2/2005 | Fukuzawa et al. | 360/324.1 |
| 6,882,509 | B2 | 4/2005 | Chang et al. | |
| 6,903,907 | B2 | 6/2005 | Hasegawa | |
| 6,905,780 | B2 | 6/2005 | Yuasa et al. | |
| 6,929,957 | B2 | 8/2005 | Min et al. | |
| 6,937,446 | B2 | 8/2005 | Kamiguchi et al. | |
| 6,937,447 | B2 | 8/2005 | Okuno et al. | |
| 7,038,893 | B2 | 5/2006 | Koui et al. | |
| 7,046,489 | B2 | 5/2006 | Kamiguchi et al. | |
| 7,116,529 | B2 | 10/2006 | Yoshikawa et al. | |
| 7,163,755 | B2 | 1/2007 | Hiramoto et al. | |
| 7,177,121 | B2 | 2/2007 | Kojima et al. | |
| 7,196,877 | B2 | 3/2007 | Yoshikawa et al. | |
| 7,218,484 | B2 | 5/2007 | Hashimoto et al. | |
| 7,223,485 | B2 | 5/2007 | Yuasa et al. | |
| 7,240,419 | B2 | 7/2007 | Okuno et al. | |
| 7,301,733 | B1 | 11/2007 | Fukuzawa et al. | |
| 7,304,825 | B2 | 12/2007 | Funayama et al. | |
| 7,331,100 | B2 | 2/2008 | Li et al. | |
| 7,372,672 | B2 | 5/2008 | Nishiyama | |
| 7,379,278 | B2 | 5/2008 | Koui et al. | |
| 7,390,529 | B2 | 6/2008 | Li et al. | |
| 7,476,414 | B2 * | 1/2009 | Fukuzawa et al. | 427/131 |
| 7,514,117 | B2 * | 4/2009 | Fukuzawa et al. | 427/127 |
| 7,525,776 | B2 | 4/2009 | Fukuzawa et al. | |
| 7,602,592 | B2 | 10/2009 | Fukuzawa et al. | |
| 7,610,674 | B2 | 11/2009 | Zhang et al. | |
| 7,776,387 | B2 | 8/2010 | Fuji et al. | |
| 7,785,662 | B2 | 8/2010 | Fuji et al. | |
| 7,842,334 | B2 * | 11/2010 | Wakui et al. | 427/130 |
| 7,897,201 | B2 * | 3/2011 | Yuasa et al. | 427/131 |
| 2001/0005300 | A1 | 6/2001 | Hayashi | |
| 2001/0009063 | A1 | 7/2001 | Saito et al. | |
| 2001/0014000 | A1 | 8/2001 | Tanaka et al. | |
| 2001/0040781 | A1 | 11/2001 | Tanaka et al. | |
| 2002/0048127 | A1 | 4/2002 | Fukuzawa et al. | |
| 2002/0048128 | A1 | 4/2002 | Kamiguchi et al. | |
| 2002/0051380 | A1 | 5/2002 | Kamiguchi et al. | |
| 2002/0054461 | A1 | 5/2002 | Fujiwara et al. | |
| 2002/0058158 | A1 | 5/2002 | Odagawa et al. | |
| 2002/0073785 | A1 | 6/2002 | Prakash et al. | |
| 2002/0114974 | A1 | 8/2002 | Carey et al. | |
| 2002/0135935 | A1 | 9/2002 | Covington | |
| 2002/0145835 | A1 | 10/2002 | Suzuki et al. | |
| 2002/0150791 | A1 | 10/2002 | Yuasa et al. | |
| 2002/0159201 | A1 | 10/2002 | Li et al. | |
| 2002/0191355 | A1 | 12/2002 | Hiramoto et al. | |
| 2003/0011463 | A1 | 1/2003 | Iwasaki et al. | |
| 2003/0026049 | A1 | 2/2003 | Gill | |
| 2003/0035256 | A1 | 2/2003 | Hayashi et al. | |
| 2003/0049389 | A1 | 3/2003 | Tsunekawa et al. | |
| 2003/0053269 | A1 | 3/2003 | Nishiyama | |
| 2003/0099868 | A1 | 5/2003 | Tanahashi et al. | |
| 2003/0104249 | A1 | 6/2003 | Okuno et al. | |
| 2003/0123200 | A1 | 7/2003 | Nagasaka et al. | |
| 2003/0128481 | A1 | 7/2003 | Seyama et al. | |
| 2003/0156360 | A1 | 8/2003 | Kawawake et al. | |
| 2004/0021990 | A1 | 2/2004 | Koui et al. | |
| 2004/0121185 | A1 * | 6/2004 | Fukuzawa et al. | 428/692 |
| 2004/0137645 | A1 | 7/2004 | Hu et al. | |
| 2004/0150922 | A1 | 8/2004 | Kagami et al. | |
| 2004/0169963 | A1 | 9/2004 | Okuno et al. | |
| 2004/0201929 | A1 | 10/2004 | Hashimoto et al. | |
| 2004/0206619 | A1 * | 10/2004 | Pinarbasi | 204/192.2 |
| 2004/0246631 | A1 | 12/2004 | Dieny et al. | |
| 2005/0042478 | A1 | 2/2005 | Okuno et al. | |
| 2005/0068855 | A1 | 3/2005 | Morikawa et al. | |
| 2005/0073778 | A1 | 4/2005 | Hasegawa et al. | |
| 2005/0094317 | A1 | 5/2005 | Funayama | |
| 2005/0094322 | A1 * | 5/2005 | Fukuzawa et al. | 360/324.1 |
| 2005/0094327 | A1 | 5/2005 | Okuno et al. | |
| 2005/0141148 | A1 | 6/2005 | Aikawa et al. | |
| 2005/0276998 | A1 | 12/2005 | Sato | |
| 2006/0002184 | A1 | 1/2006 | Hong et al. | |
| 2006/0018057 | A1 | 1/2006 | Huai | |
| 2006/0034022 | A1 | 2/2006 | Fukuzawa et al. | |
| 2006/0050444 | A1 | 3/2006 | Fukuzawa et al. | |
| 2006/0098353 | A1 | 5/2006 | Fukuzawa et al. | |
| 2006/0114620 | A1 | 6/2006 | Sbiaa et al. | |
| 2006/0164764 | A1 | 7/2006 | Kamiguchi et al. | |
| 2007/0070556 | A1 | 3/2007 | Zhang et al. | |
| 2007/0081276 | A1 | 4/2007 | Fukuzawa et al. | |
| 2007/0092639 | A1 | 4/2007 | Fuji et al. | |
| 2007/0159733 | A1 | 7/2007 | Hashimoto et al. | |
| 2007/0172690 | A1 | 7/2007 | Kim et al. | |
| 2007/0188936 | A1 | 8/2007 | Zhang et al. | |
| 2007/0188937 | A1 | 8/2007 | Carey et al. | |
| 2007/0202249 | A1 | 8/2007 | Yuasa et al. | |
| 2007/0253122 | A1 | 11/2007 | Fukuzawa et al. | |
| 2007/0259213 | A1 | 11/2007 | Hashimoto et al. | |
| 2008/0005891 | A1 | 1/2008 | Yuasa et al. | |
| 2008/0008909 | A1 | 1/2008 | Fuji et al. | |
| 2008/0013218 | A1 | 1/2008 | Fuke et al. | |
| 2008/0062577 | A1 | 3/2008 | Fukuzawa et al. | |
| 2008/0068764 | A1 | 3/2008 | Fukuzawa et al. | |
| 2008/0080098 | A1 | 4/2008 | Fuke et al. | |
| 2008/0102315 | A1 | 5/2008 | Fukuzawa et al. | |
| 2008/0192388 | A1 | 8/2008 | Zhang et al. | |
| 2008/0204944 | A1 | 8/2008 | Aikawa et al. | |
| 2008/0239590 | A1 | 10/2008 | Fuke et al. | |
| 2008/0278864 | A1 | 11/2008 | Zhang et al. | |
| 2009/0059441 | A1 | 3/2009 | Zhang et al. | |
| 2009/0061105 | A1 | 3/2009 | Fukuzawa et al. | |
| 2009/0091864 | A1 | 4/2009 | Carey et al. | |
| 2009/0091865 | A1 | 4/2009 | Zhang et al. | |
| 2009/0104475 | A1 | 4/2009 | Fuji et al. | |
| 2009/0109581 | A1 | 4/2009 | Fukuzawa et al. | |

| | | | |
|---|---|---|---|
| 2009/0141408 | A1 | 6/2009 | Fukuzawa et al. |
| 2009/0162698 | A1 | 6/2009 | Fukuzawa et al. |
| 2009/0225477 | A1 | 9/2009 | Fukuzawa et al. |
| 2010/0037453 | A1 | 2/2010 | Zhang et al. |
| 2010/0091412 | A1 | 4/2010 | Yuasa et al. |
| 2010/0091414 | A1 | 4/2010 | Yuasa et al. |
| 2010/0091415 | A1 | 4/2010 | Yuasa et al. |
| 2010/0092803 | A1 | 4/2010 | Yuasa et al. |
| 2010/0323104 | A1* | 12/2010 | Yuasa et al. .................. 427/130 |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |
| EP | 1 400 957 | 3/2004 |
| EP | 1 548 762 | 6/2005 |
| EP | 1 607 941 | 12/2005 |
| EP | 1 626 393 | 2/2006 |
| GB | 2 390 168 | 12/2003 |
| JP | 08-049063 | 2/1996 |
| JP | 09-116212 | 5/1997 |
| JP | 09-306733 | 11/1997 |
| JP | 10-173252 | 6/1998 |
| JP | 10-324969 | 12/1998 |
| JP | 11-121832 | 4/1999 |
| JP | 11-154609 | 6/1999 |
| JP | 11-238923 | 8/1999 |
| JP | 11-296820 | 10/1999 |
| JP | 2000-137906 | 5/2000 |
| JP | 2000-156530 | 6/2000 |
| JP | 2000-188435 | 7/2000 |
| JP | 2000-215414 | 8/2000 |
| JP | 2000-228004 | 8/2000 |
| JP | 2000-293982 | 10/2000 |
| JP | 2001-094173 | 4/2001 |
| JP | 2001-143227 | 5/2001 |
| JP | 2001-176027 | 6/2001 |
| JP | 2001-229511 | 8/2001 |
| JP | 2001-237471 | 8/2001 |
| JP | 2001-358380 | 12/2001 |
| JP | 2002-076473 | 3/2002 |
| JP | 2002-124721 | 4/2002 |
| JP | 2002-150512 | 5/2002 |
| JP | 2002-204010 | 7/2002 |
| JP | 2002-208744 | 7/2002 |
| JP | 2003-086866 | 3/2003 |
| JP | 2003-110168 | 4/2003 |
| JP | 2003-152243 | 5/2003 |
| JP | 2003-204095 | 7/2003 |
| JP | 2004-006589 | 1/2004 |
| JP | 2004-153248 | 5/2004 |
| JP | 2004-214234 | 7/2004 |
| JP | 2005-097693 | 4/2005 |
| JP | 2005-136309 | 5/2005 |
| JP | 2005-166896 | 6/2005 |
| JP | 2005-339784 | 12/2005 |
| JP | 2005-353236 | 12/2005 |
| JP | 2006-019743 | 1/2006 |
| JP | 2006-049426 | 2/2006 |
| JP | 2006-054257 | 2/2006 |
| JP | 2006-135253 | 5/2006 |
| JP | 2006-319343 | 11/2006 |
| JP | 2007-221135 | 8/2007 |
| KR | 10-0302029 | 6/2001 |
| KR | 2001-0081971 | 8/2001 |
| KR | 2002-0015295 | 2/2002 |
| KR | 10-2005-0027159 | 3/2005 |
| KR | 2005-0118649 | 12/2005 |
| KR | 10-2006-0050327 | 5/2006 |
| WO | 97/47982 | 12/1997 |
| WO | 03/032338 | 4/2003 |

OTHER PUBLICATIONS

International Search Report for PCT/JP2006/325995, mailed May 21, 2007.
Written Opinion of the International Searching Authority for PCT/JP2006/325995, mailed May 21, 2007.
Office Action dated Sep. 2, 2010 in Chinese application No. 200680047653.9 and partial English-language translation thereof.
S. Sanvito, et al. "Breakdown of the Resistor Model of CPP-GMR in Magnetic Multilayered Nanostructures", Physical Review B, vol. 61, No. 20, May 15, 2000, (Abstract), only abstract supplied.
Didier Bozec, et al., "Mean Free Path Effects on the Current Perpendicular to the Plane Magnetoresistance of Magnetic Multilayers", Physical Review Letters, vol. 85, No. 6, Aug. 7, 2000, (Abstract) only.
B. Dieny, et al., "Magnetotransport Properties of Magnetically Soft Spin-Valve Structures (Invited)", J. Appl. Phys., vol. 69 (8), Apr. 15, 1991, pp. 4774-4779.
B. Dieny et al., "Giant Magnetoresistance of Magnetically Soft Sandwiches: Dependence on Temperature and on Layer Thicknesses", Physical Review B, vol. 45, No. 2, Jan. 1, 1992, pp. 806-813.
D. Bozec, et al., "Comparative Study of the Magnetoresistance of MBE-Grown Multilayers: [Fe/Cu/Co/Cu]$_N$ and [Fe/Cu]$_N$ [Co/Cu]$_N$"Physical Review B, vol. 60, No. 5, Aug. 1, 1999, (Abstract)only.
Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.
A. Losev et al., "Electron Beam Induced Reduction Ofof CuO in the Presence of a Surface Carbonaceous Layer: An XPS/Hreels Study", Surface Science vol. 213 Apr. 1989 pp. 554-579, semi-legible.
K.S. Kim et al., "X-Ray Photoelectron Spectroscopic Studies of Nickel-Oxygen Surfaces Using Oxygen and Argon Ion-Bombardment", Surface Science 43 (1974), pp. 625-642.
N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926.
J.J. Versluijs, et al., "Magnetoresistance of Half-Metallic Oxide Nanocontacts," Physical Review Letters, vol. 87, No. 2, Jul. 9, 2001, pp. 026601-1 through 026601-4.
W.F. Egelhoff, et al., "Oxygen as a Surfactant in the Growth of Giant Magnetoresistance Spin Valves", J. Appl. Phys., vol. 82, No. 12, Dec. 15, 1997, abstract article only.
H.A. Ferreira et al., "Rapid DNA hybridization based on ac field focusing of magnetically labeled target DNA"; Applied Physics Letters, 87, 013901 (2005); pp. 013901-1 to 013901-3.
L. Lagae et al., "Magnetic biosensors for genetic screening of cystic fibrosis"; IEE Proc. Circuits Devices Syst. vol. 152, No. 4, Aug. 2005, pp. 393-400.
Meguro, K., Hoshiya, H., Watanabe, K., Hamakawa, Y., and Fuyama, M., "Spin-Valve films using synthetic ferrimagnets for pinned layer," (IEEE Trans. Mag., 35(5), 1999, Abstract only, no article, September.
C. Vouille et al, J.Appl.Phys. 81 (1997); "Inverse CPP-GMR in (A/Cu/Co/Cu) multilayers . . . by impurities" (Abstract)+ citation list only, vol. 81, Apr. 1997.
A.C. Reilly et al, J.Magn. Magn. Mater, vol. 195 (1999); "Perpendicular giant magnetoresistance of . . . unified picture." Abstract only supplied.
J. Bass et al, J. Magn. Magn. Mater, (1999); "Current-perpendicular (CPP) magnetoresistance in magnetic metallic multilayers." Abstract only, vol. 200.
L. Villa, et al., Journal of Applied Physics, vol. 87, No. 12, Current Perpendicular Magnetoresistances of NiFeCo and NiFe "Permalloys", Jun. 15, 2000, (Abstract) with list of citations only.
Seoul University Doctoral Thesis, A Study on the Development of New Spin Wave Structures for Magnetoresistive RAM based on Giant Magnetoresistance and Tunneling, Aug. 2001 and English-language translation of abstract.
Nagasaka et al., "Giant magnetoresistance propeties of specular spin valve films in a current perpendicular to plane structure," J. Appl. Phys., vol. 89, No. 11, pp. 6943-4965. Jun. 1, 2001.
Mazin, "How to Define and Calculate the Degree of Spin Polarization in Ferromagnets", Physical Review Letters, vol. 83, No. 7, Aug. 16, 1999, only abstract of article supplied.
Fukuzawa et al., U.S. Appl. No. 11/001,174, filed Dec. 2, 2004.
Fukuzawa et al., U.S. Appl. No. 11/199,448, filed Aug. 9, 2005.
Fuji et al., U.S. Appl. No. 11/583,968, filed Oct. 20, 2006.
Yuasa et al., U.S. Appl. No. 11/703,830, filed Feb. 8, 2007.
Fukuzawa et al., U.S. Appl. No. 11/783,011, filed Apr. 5, 2007.
Fuji et al., U.S. Appl. No. 11/802,474, filed May 23, 2007.
Fuke et al., U.S. Appl. No. 11/822,700, filed Jul. 9, 2007.

Fuke et al., U.S. Appl. No. 11/892,890, filed Aug. 28, 2007.
Zhang et al., U.S. Appl. No. 11/906,716, filed Oct. 3, 2007.
Fuke et al., U.S. Appl. No. 12/071,589, filed Feb. 22, 2008.
Fukuzawa et al., U.S. Appl. No. 12/248,578, filed Oct. 9, 2008.
Fuji et al., U.S. Appl. No. 12/314,811, filed Dec. 17, 2008.
Fukuzawa et al., U.S. Appl. No. 12/347,543, filed Dec. 31, 2008.
Yuasa et al., U.S. Appl. No. 12/585,851, filed Sep. 25, 2009.
Yuasa et al., U.S. Appl. No. 12/585,852, filed Sep. 25, 2009.
Yuasa et al., U.S. Appl. No. 12/585,854, filed Sep. 25, 2009.
Yuasa et al., U.S. Appl. No. 12/585,855, filed Sep. 25, 2009.
Yonsei University Master Thesis, "Voltage Difference Amplification Circuit for Improving the Sensing Characteristics of MRAM", Dec. 2005 and brief English language translation thereof.
Y. Kamiguchi et al., "CoFe Specular Spin Valves With a Nano Oxide Layer", The 1999 IEEE International Magnetics Conference, May 18-21, 1999.

* cited by examiner

MAGNETORESISTIVE EFFECT ELEMENT AND MANUFACTURING METHOD THEREOF

CROSS-REFERENCE TO THE INVENTION

This application is the U.S. national phase of International Application No. PCT/JP2006/325995, filed 20 Dec. 2006, which designated the U.S. and claims priority to Japan Application No. 2005-368463, filed 21 Dec. 2005, the entire contents of each of which are hereby incorporated by reference.

BACKGROUND OF THE INVENTION

1. Field of the Invention

The present invention relates to a magnetoresistive effect element which detects magnetism by passing a sense current in a direction perpendicular to a surface of a magnetoresistive effect film, and a manufacturing method thereof.

2. Description of the Related Art

The performance of magnetic devices, especially magnetic heads is dramatically enhanced by using a giant magnetoresistive effect (Giant Magneto-Resistive Effect: GMR). Application of a spin-valve film (Spin-Valve: SV film) to a magnetic head, a MRAM (Magnetic Random Access Memory) and the like has brought about great technological advance to the magnetic device field.

"Spin-valve film" is a stacked film having a structure in which a nonmagnetic spacer layer is sandwiched between two ferromagnetic layers, and is also called a spin-dependent scattering unit. Magnetization of one of the two ferromagnetic layers (called "a pinned layer", "fixed magnetization layer" and the like) is fixed with an antiferromagnetic layer or the like, and magnetization of the other layer (called "a free layer", "free magnetization layer" and the like) is rotatable in accordance with an external magnetic field. In the spin-valve film, a relative angle of the magnetization directions of the pinned layer and the free layer changes, and thereby, giant magneto-resistive change is obtained.

Magnetoresistive effect elements using spin-valve films include a CIP (Current In Plane)-GMR element, a CPP (Current Perpendicular to Plane)-GMR element, and a TMR (Tunneling Magneto Resistance) element. In the CIP-GMR element, a sense current is passed parallel with the surface of the spin-valve film, and in the CPP-GMR and TMR elements, a sense current is passed in a direction substantially perpendicular to the planes of the spin-valve film. The method of passing a sense current perpendicularly to the film plane attracts more attention as the technique adaptable to a high recording density head of the future.

Here, in a metal CPP-GMR element with a spin-valve film formed of a metal layer, the resistance change amount by magnetization is small, and it is difficult to detect a weak magnetic field (for example, the magnetic field in the magnetic disk of high recording density).

As a spacer layer, a CPP element using an oxide layer [NOL (nano-oxide layer)] including a current path in the thickness direction is proposed (see JP-A 2002-208744 (KOKAI)). In this element, both the element resistance and MR ratio can be increased by the current-confined-path [CCP (Current-confined-path)] effect. Hereinafter, the element will be called a CCP-CPP element.

Presently, magnetic storage devices such as an HDD (Hard Disk Drive) are used for personal computers, portable music players and the like. However, if the use purpose of the magnetic storage device is further increased and high density storage advances in the future, demand for reliability becomes more stringent. For example, it becomes necessary to enhance reliability under the condition at a higher temperature and under the operating environment at a higher speed. For this purpose, it is desirable to enhance reliability of the magnetic heads more than before.

A CCP-CPP element is especially low in resistance as compared with the conventional TMR element, and therefore, it is applicable to a high-end magnetic storage device for use in a server/enterprise requiring a higher transfer rate. For such a high-end use, high areal density and high reliability are required to be satisfied at the same time. For these use purposes, it is desirable to enhance reliability at a higher temperature. Namely, it becomes necessary to use a CCP-CPP element under a severer environment (high-temperature environment or the like), under more strict use conditions (read of information in a magnetic disk rotating at a high speed, and the like).

The present invention has an object to provide a magnetoresistive effect element which is applicable to a magnetic storage device of high density storage, and is enhanced in reliability, and a manufacturing method thereof.

SUMMARY OF THE INVENTION

A manufacturing method of a magnetoresistive effect element according to one mode of the present invention includes forming a first magnetic layer; forming a spacer layer including an insulating layer and a conductive layer which penetrates through the insulating layer and passes a current, on the first magnetic layer; and forming a second magnetic layer all of which or part of which is treated with ion, plasma or heat, on the formed spacer layer.

A magnetoresistive effect element according to one mode of the present invention includes a first magnetic layer, a spacer layer which is disposed on the aforesaid first magnetic layer and has an insulating layer and a conductive layer which passes a current in a layer direction of the insulating layer, and a second magnetic layer which grows on the aforesaid spacer layer, and all or part of which is treated with ion, plasma or heat.

DESCRIPTION OF THE EMBODIMENTS

Embodiments of the present invention will now be described with reference to the drawings. In the following embodiments, the composition of an alloy is expressed in atomic %.

First Embodiment

Figure 1:
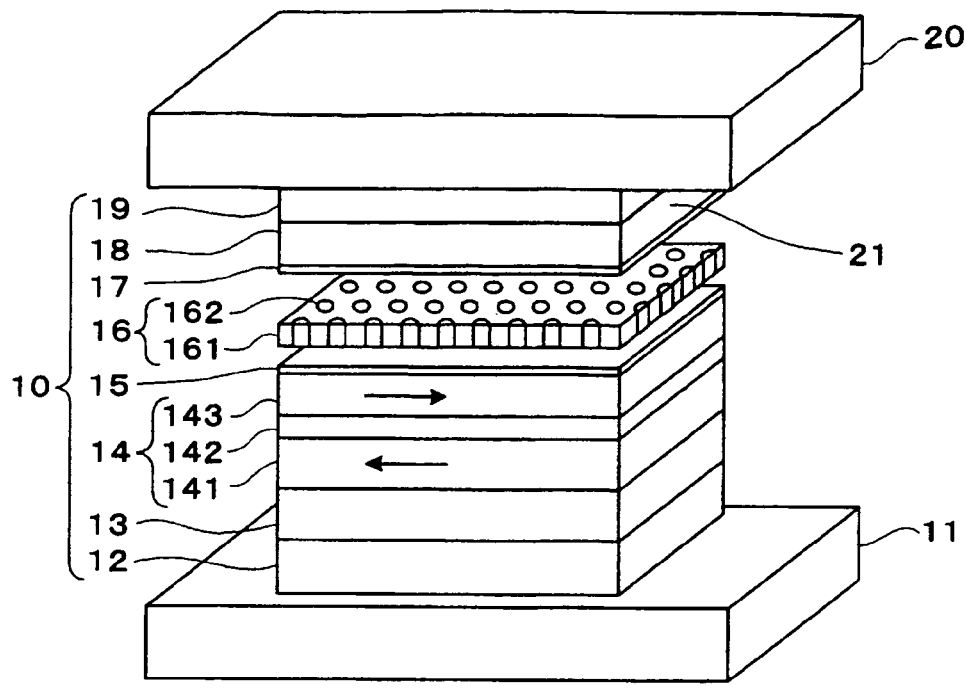
FIG. 1 is a perspective view showing a magnetoresistive effect element according to a first embodiment.

FIG. 1 is a perspective view showing a magnetoresistive effect element (CCP-CPP element) according to a first embodiment. FIG. 1 and the other drawings are all schematic views, and the ratio of the film thicknesses in the drawings and the ratio of the actual film thicknesses do not always coincide with each other.

As shown in FIG. 1, the magnetoresistive effect element according to the present embodiment has a magnetoresistive effect film 10, and a lower electrode 11 and an upper electrode 20 which sandwich it from above and below, and is constructed on a substrate not shown.

The magnetoresistive effect film 10 is constructed by a underlayer 12, a pinning layer 13, a pinned layer 14, a lower metal layer 15, a spacer layer (CCP-NOL) 16 (an insulating layer 161, a current path 162), an upper metal layer 17, a free layer 18, and a cap layer 19 being stacked in sequence. Among them, the pinned layer 14, the lower metal layer 15, the spacer layer 16, the upper metal layer 17 and the free layer 18 correspond to a spin-valve film formed by sandwiching a nonmagnetic spacer layer between two ferromagnetic layers. All of the lower metal layer 15, the spacer layer (CCP-NOL) 16 and the upper metal layer 17 are defined as the spacer layer in a broad sense. To make it easy to see, the spacer layer 16 is expressed in the state in which it is separated from the layers on and under it (the lower metal layer 15 and the upper metal layer 17).

The components of the magnetoresistive effect element will be described hereinafter.

The lower electrode 11 is an electrode for passing a current in the direction perpendicular to the spin-valve film. Voltage is applied between the lower electrode 11 and the upper electrode 20, and thereby, a current passes through the inside of the spin-valve film along the direction perpendicular to the film. By detecting the change in resistance due to the magnetoresistive effect by the current, detection of magnetization of media becomes possible. For the lower electrode 11, a metal layer with relatively small electric resistance is used to pass a current to the magnetoresistive effect element.

The underlayer 12 can be divided into, for example, a buffer layer 12a and a seed layer 12b. The buffer layer 12a is a layer for relieving roughness of the front surface of the lower electrode 11. The seed layer 12b is a layer for controlling crystal orientation and crystal grain size of the spin-valve film deposited thereon.

As the buffer layer 12a, Ta, Ti, W, Zr, Hf and Cr or alloys of them can be used. The film thickness of the buffer layer 12a is preferably about 2 to 10 nm, and is more preferably about 3 to 5 nm. When the thickness of the buffer layer 12a is too thin, the buffer effect is lost. When the thickness of the buffer layer 12a is too large on the other hand, series resistance which does not contribute to the MR ratio is increased. When the seed layer 12b which is deposited on the buffer layer 12a has the buffer effect, the buffer layer 12a does not always have to be provided. As a preferable example among the above described examples, Ta [3 nm] can be used.

For the seed layer 12b, any material that can control the crystal orientation of the layer which is deposited thereon can be used. As the seed layer 12b, a metal layer or the like having an fcc structure (face-centered cubic structure), an hcp structure (hexagonal close-packed structure), or a bcc structure (body-centered cubic structure) is preferable. For example, by using Ru having the hcp structure and NiFe having the fcc structure as the seed layer 12b, the crystal orientation of the spin-valve film thereon can be made the fcc (111) orientation. The crystal orientation of the pinning layer 13 (for example, PtMn) can be made the regulated fct structure (face-centered tetragonal structure), or bcc (body-centered cubic structure) (110) orientation.

In order to sufficiently exhibit the function as the seed layer 12b which enhances the crystal orientation, the film thickness of the seed layer 12b is preferably 1 to 5 nm, and more preferably 1.5 to 3 nm. As a preferable example among the above described examples, Ru [2 nm] can be used.

The crystal orientations of the spin-valve film and the pinning layer 13 can be measured by the X-ray diffraction. The full-width of half-maximum of the rocking curves at the fcc (111) peak of the spin-valve film, and at the fct (111) peak or the bcc (110) peak of the pinning layer 13 (PtMn) can be made 3.5 to 6 degrees, and favorable orientations can be obtained. The dispersion angle of the orientation can be discriminated from the diffraction spot using a cross-section TEM.

As the seed layer 12b, an NiFe alloy (for example, $Ni_xFe_{100-x}$ (x=90 to 50%, preferably 75 to 85%), $(Ni_xFe_{100-x})_{100-y}X_y$ (X=Cr, V, Nb, Hf, Zr, Mo) which is made nonmagnetic by doping NiFe with the third element X) can be used. In the NiFe seed layer 12b, it is relatively easy to obtain favorable crystal orientation, and the full-width of half-maximum of the rocking curves which are measured as described above can be made 3 to 5 degrees.

The seed film 12b has not only the function of enhancing crystal orientation but also the function of controlling the crystal grain size of the spin-valve film. More specifically, the crystal grain size of the spin-valve film can be controlled to be 5 to 40 nm, and even if the size of the magnetoresistive effect element becomes small, a high MR ratio can be realized without causing variation in characteristics.

The crystal grain size here can be discriminated in accordance with the grain size of the crystal grain formed on the seed layer 12b, and can be determined by the cross-section TEM or the like. In the case of a bottom type spin-valve film in which the pinned layer 14 is located below the spacer layer 16, the crystal grain size can be discriminated in accordance with the crystal grain sizes of the pinning layer 13 (antiferromagnetic layer) and the pinned layer 14 (fixed magnetization layer) which are formed on the seed layer 12b.

In a reproducing head conforming to high-density recording, the element size is, for example, 100 nm or less. The ratio of the crystal grain size to the element size being large causes variation in the characteristics of the element. It is not preferable that the crystal grain size of the spin-valve film is larger than 40 nm. More specifically, the range of the crystal grain size is preferably 5 to 40 nm, and is more preferably the range of 5 to 20 nm.

Decrease in the number of crystal grains per element area becomes the cause of variation in characteristics due to the small number of crystals, and therefore, it is not so preferable to make the crystal grain size large. It is not preferable to make the crystal grain size large especially in a CCP-CPP element in which a current path is formed. When the grain size becomes too small on the other hand, it becomes generally difficult to maintain a favorable crystal orientation. The preferable range of the crystal grain size in consideration of the upper limit and the lower limit of the crystal grain size is 5 to 20 nm.

However, for use in MRAM or the like, the element size is sometimes 100 nm or more, and if the crystal grain size is as large as about 40 nm, it sometimes does not become a serous problem. Namely, in some cases, by using the seed layer 12b, there is no harm in the crystal grain size becoming coarse.

In order to obtain the above described crystal grain size of 5 to 20 nm, as the seed layer 12b, in the case of Ru 2 nm, and $(Ni_xFe_{100-x})$ $100_{-y}X_y$ (X=Cr, V, Nb, Hf, Zr, Mo)) layer, it is preferable to set the composition y of the third element X at about 0 to 30% (including the case where y is 0%).

Meanwhile, in order to use the layer by making the crystal grain size larger than 40 nm, it is preferable to use a larger amount of additive element. When the material of the seed layer 12b is, for example, NiFeCr, the Cr amount is set at about 35 to 45%, and it is preferable to use an NiFeCr layer having a bcc structure by using the composition showing a boarder phase of fcc and bcc.

As described above, the film thickness of the seed layer 12b is preferably about 1 nm to 5 nm, and is more preferably 1.5 to 3 nm. If the thickness of the seed layer 12b is too small, the effect of the crystal orientation control or the like is lost. If the thickness of the seed layer 12b is too large on the other hand, increase in series resistance is caused, and irregularities on the interface of the spin-valve film is further caused.

The pinning layer 13 has the function of applying unidirectional anisotropy to the ferromagnetic layer to be the pinned layer 14 which is deposited thereon to fix magnetization. As the material of the pinning layer 13, antimagnetic materials such as PtMn, PdPtMn, IrMn, and RuRhMn can be used. Among them, as the material of the head conforming to high recording density, IrMn is favorable. IrMn can apply unidirectional anisotropy with thinner film thickness than PtMn, and is suitable for gap narrowing necessary for high density recording.

In order to apply unidirectional anisotropy with sufficient intensity, the film thickness of the pinning layer 13 is properly set. When the material of the pinning layer 13 is PtMn and PdPtMn, as the film thickness, about 8 to 20 nm is preferable, and 10 to 15 nm is more preferable. When the material of the pinning layer 13 is IrMn, it can apply unidirectional anisotropy with smaller film thickness than PtMn, the film thickness of 4 to 18 nm is preferable, and that of 5 to 15 nm is more preferable. As a preferable example among the above described examples, IrMn [10 nm] can be used.

As the pinning layer 13, a hard magnetic layer can be used instead of an antiferromagnetic layer. As the hard magnetic layer, for example, CoPt (Co=50 to 85%), $(Co_xPt_{100-x})_{100-y}Cr_y$ (x=50 to 85%, y=0 to 40%), and FePt (Pt=40 to 60%) can be used. Since the hard magnetic layer (especially, CoPt) is relatively small in specific resistance, increase in series resistance and area resistance RA can be suppressed.

A preferable example of the pinned layer 14 is a synthetic pinned layer composed of a lower pinned layer 141 (for example, $CO_{90}Fe_{10}$ 3.5 nm), a magnetic coupling layer 142 (for example, Ru), and an upper pinned layer 143 (for example, $Fe_{50}CO_{50}$ [1 nm]/Cu [0.25 nm])×2/$Fe_{50}CO_{50}$ [1 nm]). The pinning layer 13 (for example, IrMn) and the lower pinned layer 141 directly thereon are exchange-magnetism coupled to have unidirectional anisotropy. The lower pinned layer 141 and the upper pinned layer 143 under and on the magnetic coupling layer 142 are magnetically coupled strongly to each other so that directions of magnetization become antiparallel with each other.

As the material of the lower pinned layer 141, for example, a $Co_xFe_{100-x}$ alloy (x=0 to 100%), an $Ni_xFe_{100-x}$ alloy (x=0 to 100%), or the materials made by adding non-magnetic elements to them can be used. As the material of the lower pinned layer 141, single elements of Co, Fe and Ni and alloys of them may be used.

The magnetic film thickness (saturation magnetization Bs×film thickness t (Bs·t product)) is preferably substantially equal to the magnetic film thickness of the upper pinned layer 143. Namely, the magnetic film thickness of the upper pinned layer 143 and the magnetic film thickness of the lower pinned layer 141 preferably correspond to each other. As one example, when the upper pinned layer 143 is ($Fe_{50}CO_50$ [1 nm]/Cu [0.25 nm])×2/$Fe_{50}CO_{50}$ [1 nm], the saturation magnetism of FeCo in a thin film is about 2.2 T, and therefore, the magnetic film thickness becomes 2.2 T×3 nm=6.6 Tnm. The saturation magnetization of $Co_{90}Fe_{10}$ is about 1.8 T, and therefore, the film thickness t of the lower pinned layer 141 which gives the magnetic film thickness equal to the above description becomes 6.6 Tnm/1.8 T=3.66 nm. Accordingly, it is desirable to use $Co_{90}Fe_{10}$ of a film thickness of about 3.6 nm.

The film thickness of the magnetic layer used for the lower pinned layer 141 is preferably about 2 to 5 nm. It is based on the viewpoint of the unidirectional anisotropic magnetic field intensity by the pinning layer 13 (for example, IrMn) and the antiferromagnetic coupling magnetic field intensity of the lower pinned layer 141 and the upper pinned layer 143 via the magnetic coupling layer 142 (for example, Ru). As a preferable example, $Co_{90}Fe_{10}$ of a film thickness of 3.6 nm is cited.

The magnetic coupling layer 142 (for example, Ru) has the function of causing antiferromagnetic coupling to the upper and lower magnetic layers (the lower pinned layer 141 and the upper pinned layer 143) to form a synthetic pin structure. The film thickness of the Ru layer as the magnetic coupling layer 142 is preferably 0.8 to 1 nm. The materials other than Ru may be used if only the materials cause sufficient antiferromagnetic coupling to the upper and lower magnetic layers. In place of the film thickness of 0.8 to 1 nm corresponding to the second peak of RKKY (Ruderman-Kittel-Kasuya-Yoshida) coupling, the film thickness of 0.3 to 0.6 nm corresponding to the first peak of RKKY coupling can be used. Here, Ru of 0.9 nm with which highly reliable coupling is stabilized and the characteristics can be obtained is cited as an example.

As one example of the upper pinned layer 143, a magnetic layer such as ($Fe_{50}CO_{50}$ [1 nm]/Cu [0.25 nm])×2/$Fe_{50}CO_{50}$

[1 nm] can be used. The upper pinned layer 143 forms part of the spin-dependent scattering unit. The upper pinned layer 143 is a magnetic layer which directly contributes to the MR effect, and in order to obtain a large MR ratio, both the composing material and film thickness are important. The magnetic material located on the interface with the spacer layer 16 is especially important in the respect of contribution to the spin-dependent interface scattering.

The effect of using $Fe_{50}CO_{50}$ having the bcc structure used here as the upper pinned layer 143 will be described. When the magnetic material having the bcc structure is used as the upper pinned layer 143, the spin-dependent interface scattering effect is large, and therefore, a large MR change of rate can be realized. As an FeCo alloy having the bcc structure, $Fe_xCo_{100-x}$ (x=30 to 100%), and an alloy with an additive element added to $Fe_xCo_{100-x}$ are cited. Among them, $Fe_{40}CO_{60}$ to $Fe_{90}CO_{10}$ which satisfy the various characteristics are examples of the material easy to use.

When the upper pinned layer 143 is formed of a magnetic layer having the bcc structure with which a high MR ratio is easily realized, the entire film thickness of the magnetic layer is preferably 1.5 nm or more. It is to keep the bcc structure stable. Since the metal layer used for the spin-valve film has the fcc structure or the fct structure in many cases, only the upper pinned layer 143 can have the bcc structure. For this reason, if the film thickness of the upper pinned layer 143 is too thin, it becomes difficult to keep the bcc structure stable, and a high MR ratio is not obtained.

In this case, as the upper pinned layer 143, $Fe_{50}CO_{50}$ including extra-thin Cu layers is used. In this case, the upper pinned layer 143 is composed of FeCo of an entire film thickness of 3 nm and Cu of 0.25 nm stacked on each FeCo of 1 nm, and the total film thickness is 3.5 nm.

The film thickness of the upper pinned layer 143 is preferably 5 nm or less. This is for obtaining a large pin fixed magnetic field. To make a large pin fixed magnetic field and stability of the bcc structure compatible, the film thickness of the upper pinned layer 143 having the bcc structure is preferably about 2.0 nm to 4 nm.

For the upper pinned layer 143, instead of the magnetic material having the bcc structure, a $Co_{90}Fe_{10}$ alloy having the fcc structure widely used in the conventional magnetoresistive effect element, and a cobalt alloy having the hcp structure can be used. As the upper pinned layer 143, a single metal such as Co, Fe or Ni, or an alloy material including any one element of them can be all used. Listing the materials in the order of the most advantageous first as the magnetic material of the upper pinned layer 143, an FeCo alloy material having the bcc structure, a cobalt alloy having the cobalt composition of 50% or more, and a nickel alloy having the Ni composition of 50% or more are listed in this order.

Those cited as examples here can be used in such a manner as the magnetic layers (FeCo layers) and the nonmagnetic layers (extra-thin Cu layers) are alternately stacked on each other as the upper pinned layer 143. In the upper pinned layer 143 having such a structure, the spin-dependent scattering effect which is called a spin-dependent bulk scattering effect can be enhanced by the extra-thin Cu layers.

"Spin-dependent bulk scattering effect" is used as a paired word with the spin-dependent interface scattering effect. The spin-dependent bulk scattering effect is the phenomenon which exerts the MR effect inside the magnetic layer. The spin-dependent interface scattering effect is the phenomenon which exerts the MR effect in the interface of the spacer layer and the magnetic layer.

Enhancement in the bulk scattering effect by the stacked structure of the magnetic layer and the nonmagnetic layer will be described hereinafter.

In the CCP-CPP element, a current is confined in the vicinity of the spacer layer 16, and therefore, contribution of the resistance in the vicinity of the interface of the spacer layer 16 is very large. Namely, the ratio of occupation of the resistance at the interface of the spacer layer 16 and the magnetic layer (the pinned layer 14 and the free layer 18) in the resistance of the entire magnetoresistive effect element is large. This shows that the contribution of the spin-dependent interface scattering effect is very large and important in the CCP-CPP element. Namely, selection of the magnetic material located in the interface of the spacer layer 16 has the important meaning as compared with the case of the conventional CPP element. This is the reason why the FeCo alloy layer having the bcc structure with a large spin-dependent interface scattering effect is used as the pinned layer 143 and is as described above.

However, use of a material with a large bulk scattering effect cannot be ignored, and is also important to obtain a higher MR ratio. The film thickness of an extra thin Cu layer for obtaining the bulk scattering effect is preferably 0.1 to 1 nm, and is more preferably 0.2 to 0.5 nm. If the film thickness of the Cu layer is too thin, the effect of enhancing the bulk scattering effect becomes weak. If the film thickness of the Cu layer is too thick, the bulk scattering effect decreases, and the magnetic coupling of the upper and lower magnetic layers via the nonmagnetic Cu layer becomes weak, and the characteristics of the pinned layer 14 becomes insufficient. Thus, in the one cited as a preferable example, Cu of 0.25 nm is used.

As the material of the nonmagnetic layer between the magnetic layers, Hf, Zr, Ti and the like may be used instead of Cu. When these extra thin nonmagnetic layers are inserted, the film thickness per one layer of the magnetic layer of FeCo or the like is preferably 0.5 to 2 nm, and is more preferably about 1 to 1.5 nm.

As the upper pinned layer 143, instead of the alternately stacked structure of the FeCo layer and the Cu layer, the layer made by alloying FeCo and Cu may be used. As such an FeCoCu alloy, for example, $(Fe_xCo_{100-x})_{100-y}Cu_y$ (x=30 to 100%, y=about 3 to 15%) is cited, but the composition range other than this may be used. Here, as the element added to FeCo, the other elements such as Hf, Zr, and Ti may be used instead of Cu.

For the upper pinned layer 143, single layer films composed of Co, Fe, Ni, and alloy materials of them may be used. For example, as the upper pinned layer 143 of the simplest structure, a $Co_{90}Fe_{10}$ single layer of 2 to 4 nm which is conventionally used widely may be used. Another element may be added to this material.

Next, a film composition which forms a spacer layer in a broad sense will be described. The lower metal layer 15 is used for formation of the current path 162, and is a so-called supply source of the current path 162. However, it does not have to remain as a definite metal layer after formation of the current path 162. The lower metal layer 15 is a material which forms part of the spacer layer in a broad sense. The lower metal layer 15 has the function of a stopper layer which suppresses oxidation of the magnetic layer 143 located at a bottom part when the spacer layer 16 on the top portion thereof is formed.

The spacer layer (CCP-NOL) 16 has the insulating layer 161 and the current path 162. As described above, the spacer layer 16, the lower metal layer 15 and the upper metal layer 17 are all treated as the spacer layer in a broad sense.

The insulating layer 161 is composed of an oxide, a nitride, an oxynitride and the like. As the insulating layer 161, either the amorphous structure such as $Al_2O_3$ or the crystal structure such as MgO can be used. In order to exhibit the function of the spacer layer, the thickness of the insulating layer 161 is preferably 1 to 3 nm, and the range of 1.5 to 2.5 nm is more preferable.

As the typical insulating material used in the insulating layer 161, there are a material with $Al_2O_3$ used as the base material, and a material which is $Al_2O_3$ doped with an additive element. As the additive element, Ti, Hf, Mg, Zr, V, Mo, Si, Cr, Nb, Ta, W, B, C, V and the like are cited. The doping amounts of these additive elements can be changed properly in the range of 0% to about 50%. As an example, $Al_2O_3$ of about 2 nm can be used as the insulating layer 161.

For the insulating layer 161, a Ti oxide, an Hf oxide, an Mg oxide, a Zr oxide, a Cr oxide, a Ta oxide, an Nb oxide, an Mo oxide, an Si oxide, a V oxide and the like can be used, in place of an Al oxide such as $Al_2O_3$. In the case of these oxides, the above described materials can be used as the additive elements. The amount of the additive element can be properly changed in the range of 0% to about 50%.

Oxynitrides and nitrides with Al, Si, Hf, Ti, Mg, Zr, V, Mo, Nb, Ta, W, B, and C as described above as the base may be used in place of these oxides as long as the materials have the function of insulating a current.

The current path 162 is the path (route) for passing a current perpendicularly to the film plane of the spacer layer 16 and for confining the current. The current path 162 functions as a conductor for passing a current in the direction perpendicular to the film plane of the insulating layer 161, and can be composed of a metal layer of Cu or the like, for example. Namely, the spacer layer 16 has a current-confined-path structure (CCP structure), and is capable of increasing the MR ratio by the current confining effect. As the material forming the current path 162 (CCP), an alloy layer of Au, Ag, Ni, Co or Fe or an alloy layer including at least one of these elements can be cited except for Cu. As one example, the current path 162 can be formed by an alloy layer including Cu. Alloy layers of CuNi, CuCo, CuFe and the like can be used. Here, the composition having Cu of 50% or more is preferable to decrease a high MR ratio and the interlayer coupling field, Hin of the pinned layer 14 and the free layer 18.

The current path 162 is the area with extremely low oxygen and nitrogen contents as compared with the insulating layer 161 (they differ in contents of oxygen and nitrogen by at least twice), and is a crystal phase in general. The crystal phase is smaller in resistance than a non-crystal phase, and therefore, easily functions as the current path 162.

The upper metal layer 17 forms part of the spacer layer in a broad sense. The upper metal layer 17 has the function as the barrier layer which protects the free layer 18 deposited thereon from being oxidized by being in contact with the oxide of the spacer layer 16, and the function of making crystallinity of the free layer 18 favorable. For example, when the material of the insulating layer 161 is amorphous (for example, $Al_2O_3$), crystallinity of the metal layer deposited thereon deteriorates, but by disposing the layer (for example, a Cu layer) which makes the fcc crystallinity favorable (the film thickness of about 1 nm or less is suitable), it becomes possible to remarkably improve the crystallinity of the free layer 18.

Depending on the material of the spacer layer 16 and the material of the free layer 18, the upper metal layer 17 may not necessarily provided. By optimization of the annealing condition, selection of the material of the insulating layer 161 of the spacer layer 16, the material of the free layer 18 and the like, reduction in crystallinity is avoided, and the metal layer 17 on the spacer layer 16 can be made unnecessary.

However, considering a margin in manufacture, it is preferable to form the upper metal layer 17 on the spacer layer 16. As a preferable example, as the upper metal layer 17, Cu [0.5 nm] can be used.

As the composing material of the upper metal layer 17, Au, Ag, Ru and the like can be used other than Cu. The material of the upper metal layer 17 is preferably the same as the material of the current path 162 of the spacer layer 16. When the material of the upper metal layer 17 differs from the material of the current path 162, increase in the interface resistance is caused, but if both of them are of the same material, increase in the interface resistance does not occur.

The film thickness of the upper metal layer 17 is preferably 0 to 1 nm, and is more preferably 0.1 to 0.5 nm. If the upper metal layer 17 is too thick, the current confined in the spacer layer 16 spreads in the upper metal layer 17 to provide an insufficient current confinement effect, and reduction in the MR ratio is caused.

The free layer 18 is the layer having a ferromagnetic substance of which magnetizing direction changes in accordance with the external magnetic field. For example, a two-layer construction of $Co_{90}Fe_{10}$ [1 nm]/$Ni_{33}Fe_{17}$ [3.5 nm] using NiFe with CoFe inserted in the interface is cited as one example of the free layer 18. In this case, it is more preferable to provide a CoFe alloy in the interface with the spacer layer 16 than an NiFe alloy. In order to obtain a high MR ratio, selection of the magnetic material of the free layer 18 located in the interface of the spacer layer 16 is important. When the NiFe layer is not used, a $Co_{90}Fe_{10}$ [4 nm] single layer can be used. A free layer composed of a three-layer composition such as CoFe/NiFe/CoFe may be used.

Among the CoFe alloys, $Co_{90}Fe_{10}$ is preferable because it has stable soft magnetic properties. When a CoFe alloy in the vicinity of $Co_{90}Fe_{10}$ is used, the film thickness is preferably set at 0.5 to 4 nm. Other than this, $Co_xFe_{100-x}$ (x=70 to 90) is preferable.

As the free layer 18, the layer made by alternately stacking a plurality of CoFe layers or Fe layers each of 1 to 2 nm and a plurality of extra-thin Cu layers each of about 0.1 to 0.8 nm may be used.

When the spacer layer 16 is formed from a Cu layer, a large MR ratio is obtained by using an FeCo layer of bcc in the free layer 18 as the material of the interface with the spacer layer 16 as in the pinned layer 14. As the material of the interface with the spacer layer 16, an FeCo alloy of bcc can be used instead of a CoFe alloy of fcc. In this case, $Fe_xCo_{100-x}$ (x=30 to 100), and the material made by doping this with an additive element, in which a bcc layer is easily formed, can be used. Among these compositions, as one preferable example, $Co_{90}Fe_{10}$ [1 nm]/$Ni_{83}Fe_{17}$ [3.5 nm] can be used.

Here, the point of this embodiment is that the magnetic layer formed on CCP-NOL, that is, at least part of the free layer 18 in the case of the bottom type spin-valve film cited here as the example is made a stress controlled part 21, and thereby, reliability of the element can be remarkably improved. This treatment exerts an enormous effect due to a significant difference between crystallinity of the magnetic layer (pinned layer 14) formed under the spacer layer in a broad sense, and crystallinity of the magnetic layer (free layer 18) formed on the spacer layer in a broad sense. The detail of the treatment will be described later.

The cap layer 19 has the function of protecting the spin valve layer. The cap layer 19 can be composed of a plurality of metal layers, for example, a two-layer structure of a Cu layer and an Ru layer (Cu [1 nm]/Ru [10 nm]). As the cap layer 19, a Ru/Cu layer with Ru disposed on the free layer 18 side can be used. In this case, the film thickness of Ru is preferably about 0.5 to 2 nm. The cap layer 19 of this composition is desirable especially when the free layer 18 is composed of NiFe. This is because magnetostriction of the interface mixing layer which is formed between the free layer 18 and the cap layer 19 can be reduced since Ru is in the insoluble relation with Ni.

When the cap layer 19 is either Cu/Ru, or Ru/Cu, the film thickness of the Cu layer is preferably about 5 to 10 nm, and the film thickness of the Ru layer can be set at about 0.5 to 5 nm. Since Ru is high in specific resistance value, it is not preferable to use a too thick Ru layer, and therefore, such a film thickness range is preferable.

As the cap layer 19, other metal layers may be provided instead of a Cu layer and an Ru layer. The composition of the cap layer 19 is not especially limited, and the other materials may be used if only they are capable of protecting the spin-valve film as the cap. However, since the MR ratio and long-term reliability may change depending on selection of the cap layer, care should be taken. Cu and Ru are also examples of the desirable material of the cap layer from these viewpoints.

The upper electrode 20 is an electrode for passing a current in the direction perpendicular to the spin-valve film. Voltage is applied between the lower electrode 11 and the upper electrode 20, whereby the current in the direction perpendicular to the spin-valve film passes inside the spin-valve film. For the upper electrode layer 20, a material with electrically low resistance (for example, Cu, Au, NiFe) is used.

(Significance of the Stress Controlled Part 21)

Here, the stress controlled part 21 which is feature of this embodiment will be described in detail. The stress controlled part 21 is a region to which stress control treatment (SCT) is applied in the manufacturing process of the magnetic layer formed on the spacer layer (CCP-NOL) 16. As one example, when the free layer 18 is formed of CoFe/NiFe as descried above, the entire free layer 18 can be considered as the stress controlled part 21.

When the area which is subjected to the SCT (stress controlled part 21) and the area which is not subjected to the SCT exist in the free layer 18, a definite boarder does not generally exist between them.

In this embodiment, the pinned layer 14 is disposed at the lower layer side from the spacer layer in a broad sense (bottom type spin-valve film), and therefore, the magnetic layer formed on the spacer layer (CCP-NOL) 16 becomes the free layer 18 (in the case of a top type spin-valve film, the magnetic layer formed on the spacer layer (CCP-NOL) 16 becomes the pinned layer 14).

Namely, in this embodiment, SCT is applied to part (or all) of the free layer 18. The SCT is the treatment for controlling the internal stress of the free layer 18. By performing the treatment, residual film stress of the free layer 18 is shifted to the compressive side (compression) as compared with the state where the treatment is not performed, and thereby, reliability of the magnetoresistive effect element can be enhanced. For example, when the residual film stress of the free layer 18 has large Tensile stress (tensile stress), the absolute value of the Tensile stress can be reduced.

The detail of the SCT will be described later, the SCT means the treatment by any of ion, plasma and heat at the time of formation of a thin film of the magnetic layer.

A. Occurrence of Internal Stress in the Free Layer 18

A mechanism in which the residual film stress becomes large in the magnetic layer formed on the current-confined-path type spacer layer in a broad meaning will be described hereinafter. Here, as an example, a bottom type spin-valve film in which the pinned layer 14 is disposed at the lower layer side from the spacer layer will be described. In the case of the bottom type spin-valve film, the magnetic layer formed on the spacer layer becomes the free layer 18, and therefore, SCT is applied to the free layer 18. In the case of a top type spin-valve film, the magnetic layer which is formed on the upper side of the spacer layer becomes the pinned layer 14, and therefore, the layer to which the SCT is applied is the pinned layer 14.

As described above, the two ferromagnetic layers below and above the spacer layer 16 (the pinned layer 14, the free layer 18) are formed of Fe, Co, Ni, or alloy layers including these elements, and are formed by using the similar metal materials.

However, it is found out that these two ferromagnetic layers differ in crystallinity. More specifically, the crystallinity of the free layer 18 is inferior to the crystallinity of the pinned layer 14. This is considered to be because the insulating layer 161 of the spacer layer 16 is composed of a material relatively inferior in crystallinity (typically, an amorphous material of alumina ($Al_2O_3$) or the like). The film which grows on the amorphous material is generally inferior in crystallinity. As described above, the crystallinity of the free layer 18 is inferior to the crystallinity of the pinned layer 14.

This is the problem of not only a CCP-NOL, but also a TMR film which does not have a current-confined-path structure and composed of a uniform $Al_2O_3$, MgO, and TiOx layer. From this, a manufacturing method using SCT can be applied to a TMR film.

In the case of a TMR film, the composition in which the pin layer is a CoFe alloy layer or a CoFeB alloy layer of 2 to 3 nm, the spacer layer is $Al_2O_3$, TiOx or MgO of 1 to 2.5 nm, and the free layer is a CoFe alloy layer of 1 to 3 nm/NiFe of 2 to 4 nm is cited. As in the pinned layer, in the free layer, a CoFeB alloy layer may be also used in the interface with the insulating layer of the spacer layer. The pinned layer under Ru, the antiferromagnetic layer, and the underlayer other than the pinned layer, the spacer layer and the free layer, and the cap layer on the free layer are the same as in the above described case of the current-confined-path CPP element. In the case of the TMR element, a current path penetrating through the insulating layer material of the spacer layer perpendicularly to the film plane does not exist, and the current passing perpendicularly to the film plane flows by tunnel conduction.

In the case of a bottom type spin-valve film, the material formed on the spacer layer is the free layer 18, and therefore, the SCT is performed for the free layer 18. In a TMR element, crystallinity of the magnetic layer formed on the tunnel barrier spacer layer of $Al_2O_3$, $TiO_x$, MgO or the like is inferior as compared with the crystallinity of the magnetic layer formed under it, and therefore, the SCT exerts an effect.

However, it is found out that in the CCP-CPP element, as a severer problem than in the TMR element, in the magnetic layer formed on the CCP-NOL (current-confined-path type NOL, spacer layer), crystallinity is not only inferior on average but also ununiform within the film plane. In the free layer 18, the current path 162 of a metal material is disposed in the insulating layer 161 of an oxide such as alumina ($Al_2O_3$). The metal material as the current path 162 penetrates through the insulating layer 161 and is crystallographically bonded to the lower pinned layer 14, and has a relatively favorable crystal structure reflecting the crystal structure of the pinned layer 14. Namely, the free layer 18 has a matrix structure in which different crystal structures (the magnetic layer composed of a relatively favorable crystal structure grown on the metal layer (current path 162) of Cu or the like of CCP, and the magnetic layer inferior in crystallinity grown on the insulating layer 161 of amorphous $Al_2O_3$ or the like) mixedly exist in the two-dimensional plane. Namely, on the surface of the free layer 18, the region with a relatively favorable crystal structure (corresponding to the current path 162) and the region inferior in crystal structure (corresponding to the insulating layer 161) are distributed.

As described above, the upper metal layer 17 (for example, the extra thin Cu layer) has the function of making the crystallinity of the free layer 18 deposited thereon favorable. However, it is difficult to make the crystal orientation of the free layer 18 favorable only with the upper metal layer 17. There is the method of attempting improvement of crystallinity of the magnetic layer by using Cu of 3 nm or more as the upper metal layer 17 only for improvement of crystallinity, but this is not realistic because this loses the original function as the magnetoresistive effect element. When the upper metal layer 17 becomes thicker than 1 nm, the current-confined-path effect for the purpose of increasing the MR ratio is significantly lost, and increase in the MR ratio is lost. In order to obtain the current-confined-path effect efficiently, the upper metal layer 17 is preferably 1 nm or less (more preferably, 0.6 nm or less). Since it is extremely difficult to improve crystallinity of the magnetic layer formed thereon with such a thin upper metal layer 17, the SCT as in this embodiment is required.

Poor crystal orientation of the free layer 18 becomes the cause of occurrence of large stress (especially, tensile stress) in the free layer 18. Such a situation, as will be described later, the internal stress of the free layer 18 can be a factor of reduction in reliability of the magnetoresistive effect element.

Further, unlike the TMR element, in the CCP-CPP element, the current passing through the spacer layer perpendicular to the film plane is all metal-conductive, which conducts the metal layers, and differs from tunnel conduction via the insulating layer in the TMR element. Since in the metal conduction, Joule heat occurs more remarkably, and further in the CCP, Joule heat by large current density is locally concentrated, the thermal conditions become severer than in the TMR element.

In the CCP-CPP element, low resistance is easily realized due to metal conduction of the current flowing in the spacer layer perpendicularly to the film plane, and therefore, the CCP-CPP element is easily applied to a high transfer rate. The CCP-CPP element does not have the problem of the shot noise due to tunnel conduction which is the problem unavoidable in the TMR element, and therefore, easily obtains a favorable S/N ratio (Signal to Noise Ratio). As this, the CCP-CPP element is suitable for a high density head adaptable to high areal density and high transfer rate, and has a larger merit than the TMR element. However, in the CCP-CPP element, Joule heat locally occurs in the CCP part due to metal conduction in the CCP part in which a current is locally passed. Local heat generation is the problem peculiar to CCP, and for use under a high-temperature environment, in the CCP-CPP element, a film control is required to be performed more completely than in the TMR element.

B. Increase in Reliability of Magnetoresistive Effect Element by SCT

Influence the internal stress of the free layer 18 has on the reliability of the magnetoresistive effect element will be described.

Figure 2A:
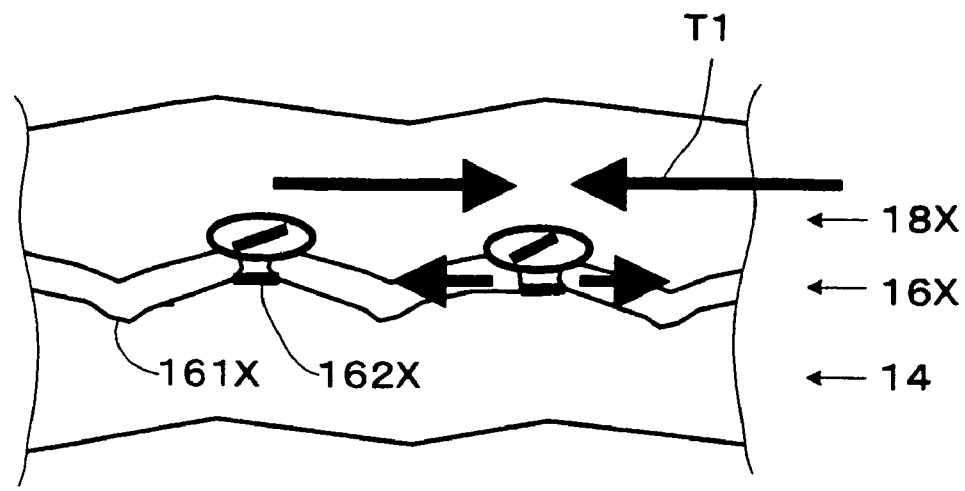
FIG. 2A is a schematic view showing a spin-valve film to which stress control treatment (SCT) is not applied.
Figure 2B:
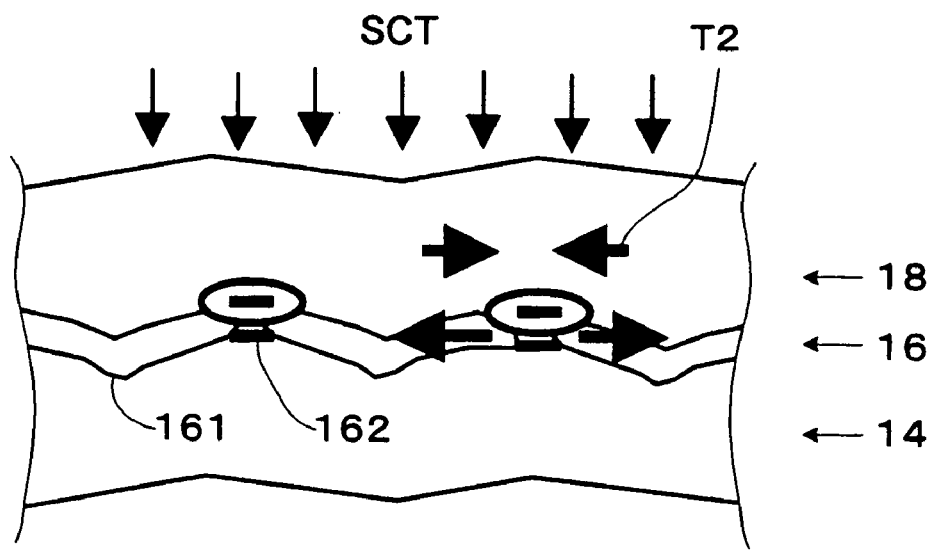
FIG. 2B is a schematic view showing a spin-valve film to which SCT is applied.

FIGS. 2A and 2B are schematic views showing a spin-valve film for which the SCT is not performed, and a spin-valve film (pinned layer 14/spacer layer 16/free layer 18) for which the SCT is performed. Here, in order to show the situation remarkably, the situation under the environment with high stress in which it is not actually used is schematically shown.

In this case, an example of the bottom type spin-valve film in which the pinned layer 14 is disposed at the lower layer side from the spacer layer 16 is shown, but the situation is the same with the top type spin-valve film in which the pinned layer 14 is disposed at the upper layer side from the spacer layer 16. In the case of the top type spin-valve film, the SCT is applied to the pinned layer 14 formed on the upper layer side from the spacer layer 16. If the free layer 18 and the pinned layer 14 are exchanged in the case of the top type in the following description, the essential effect of the SCT is totally the same.

In the spin-valve film in FIG. 2A, the SCT is not performed, and large tensile stress T1 tends to occur to a free layer 18x. The stress T1 is applied to a spacer layer 16x, and causes stress to an interface (spin-dependent scattering interface) of the spacer layer 16x especially with the free layer 18x. When the magnetoresistive effect element having the spacer layer 16x in the stressed state is operated, there is the possibility of occurrence of deterioration of the spin-valve film with time with both reversible change and irreversible change, and there is the fear of reduction in sensitivity of the magnetoresistive effect element, for example. This does not become the problem when usual recording density and use environment are equivalent to the conventional ones, but this is likely to be a problem under a severer high-temperature environment and a situation of high-speed rotation. Use purpose of an HDD increases more and more in recent years, and higher reliability than the conventional one is required.

On the other hand, in the spin-valve film in FIG. 2B, the SCT is performed, and therefore, a tensile stress T2 of the free layer 18 becomes small (large Tensile stress is relieved). As the tensile stress T2 is reduced, stress in the spacer layer 16 and the spin-dependent scattering interface becomes small. Therefore, deterioration of the spin-valve film with time when the magnetoresistive effect element is operated becomes small.

As above, reliability of the magnetoresistive effect element can be enhanced by the SCT for the free layer 18. It may be a part in the layer of the free layer 18 that is subjected to the SCT. This is because the stress in the spacer layer 16 and the pin-dependent scattering interface can be reduced if the SCT is applied to a part of the free layer 18 depending on the conditions of SCT.

As described above, all or part of the free layer 18 is made the stress control part 21 which is subjected to the SCT, and thereby, high reliability of the magnetoresistive effect element is enhanced.

C. Comparison with the Tunnel Magnetoresistive Element

As a kind of a magnetoresistive effect element, a tunnel magnetoresistance (TMR (Tunnel MagnetoResistance)) element is cited. The TMR element is composed with an extra thin insulator (hereinafter, called "TMR film") between two ferromagnetisms, and detects magnetism by a tunnel magnetoresistance effect (TMR effect).

The TMR element is similar to the CCP-CPP element in the respect that it has an insulator and the crystal orientation of the film grown thereon becomes bad. However, due to the following reasons (1) and (2), in the spin-valve film having the spacer layer 16, control of the residual film stress which is stricter than the TMR film is considered to be necessary.

(1) As described above, in the CCP-CPP element, the free layer 18 has the complicated structure in which the parts with favorable crystallinity and the parts with poor crystallinity are disposed in the matrix shape. Part of the free layer 18 is formed on the current path 162, and has relatively favorable crystal orientation which connects to the pinned layer 14. The other part of the free layer 18 is formed on the insulating layer 161, and has poor crystal orientation. Such ununiformity of crystallinity becomes a factor of increase in stress in the free layer 18.

(2) As compared with the current density in the TMR film, current density in the spacer layer 16 is high, and the element is susceptible to heat generation. In the spacer layer 16, the current is partially concentrated (confined). Therefore, when the same stress is applied, the CCP-CPP element is more susceptible to heat than the TMR element. On the other hand, in the TMR element, the current flows uniformly on the film plane, and therefore, the value of the current density is small as compared with the local current density of the CCP part.

As above, in the CCP-CPP element, the stress of the film, and influence of the stress given to the reliability both tend to be large.

(Manufacturing Method of the Magnetoresistive Effect Element)

A manufacturing method of a magnetoresistive effect element in this embodiment will be described.

Figure 3:
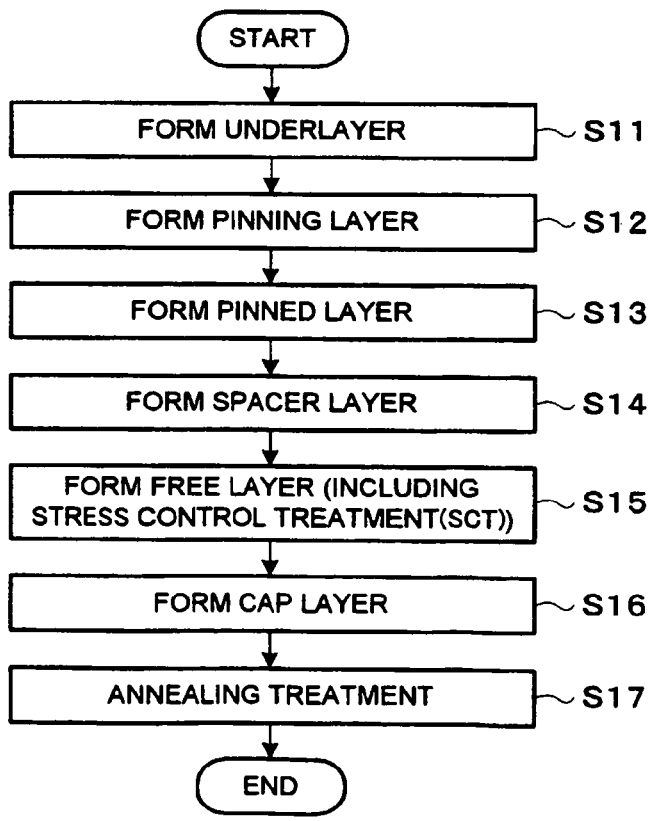
FIG. 3 is a flow chart showing a manufacture process of the magnetoresistive effect element according to the first embodiment.

FIG. 3 is a flow chart showing a manufacturing process of a magnetoresistive effect element according to the first embodiment of the present invention.

As shown in the flow chart, the underlayer 12 to the cap layer 19 are formed in sequence (steps S11 to S17). On formation of the free layer 18, stress control treatment (SCT) is applied to all or part of the free layer 18 to form it as the stress controlled part 21.

A. SCT after Film Deposition/During Film Deposition

The SCT is the treatment for controlling the residual stress of the free layer 18. The SCT will be described hereinafter.

As the SCT, the SCT after film deposition and the SCT during film deposition are conceivable.

(1) SCT after Film Deposition

The SCT after film deposition will be described.

Figure 4:
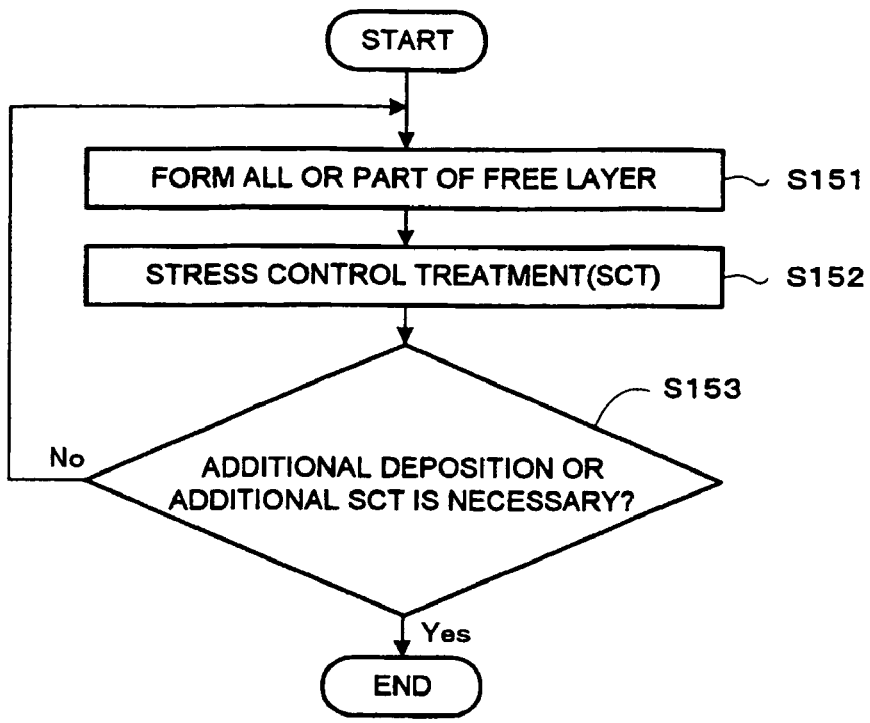
FIG. 4 is a flow chart showing an example of details of step S15 in FIG. 3.

FIG. 4 is a flow chart showing one example of the details of step S15 in FIG. 3, and showing one example of the SCT after film deposition.

Figure 5:
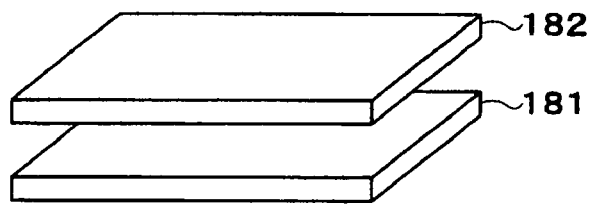
FIG. 5 is a perspective view showing a free layer manufactured in the process step in FIG. 4.

In the SCT after film deposition, after formation of all or a part of the free layer 18 (step S151), the SCT is applied (step S152). The treatment is repeated until additional film deposition or additional SCT is not required. For example, as shown in FIG. 5, the free layer 18 is formed by being divided into a first and a second layers 181 and 182, and the SCTs are performed correspondingly to the divisions. The SCTs to the respective surfaces of the first and the second layers 181 and 182 are possible. Here, it is conceivable to make the intensity of the SCT in the first layer 181 lower than the intensity of the SCT to the second layer 182 as will be described later. It is for reducing an adverse effect on the spacer layer 16 and the like.

In the first and the second layers 181 and 182 in FIG. 5, the entire first layer 181 may not be formed of the same material. For example, when in the two-layer free layer of CoFe/NiFe, SCT is performed after part of the CoFe layer and the NiFe layer is formed, and the SCT treatment is performed after the rest of the NiFe layer is deposited, the first CoFe/NiFe layer is treated as the first layer 181, and the rest of the NiFe layer is treated as the second layer 182.

In this example, the free layer 18 is formed by two separate depositions, but the deposition may be one or three or more.

The SCT after film deposition will be described in a concrete example hereinafter.

A CoFe alloy layer to be a material of the interface of the free layer 18 is formed on the upper metal layer 17 (extra thin Cu layer). As the CoFe alloy layer, $Co_{90}Fe_{10}$ can be used. As the CoFe alloy layer, CoFe composition of the bcc structure containing Fe of 30% or more, more specifically, $Co_xFe_{100-x}$ (x=95 to 0) can be used. The film thickness of the CoFe alloy layer is preferably about 1 to 2 nm.

An NiFe layer for keeping the soft magnetism of the free layer 18 favorable is formed on the CoFe alloy layer. As the composition of the NiFe layer, $Ni_xFe_{100-x}$ (x=75 to 95 atomic %) or the like can be used. As the film thickness, about 1 to 4 nm is the preferable range. A stress control process of the free layer 18 formed from such stacked magnetic layers becomes important.

Formation of the free layer will be described in sequence hereinafter. As a part of the free layer 18, a CoFe layer which forms an interface layer with the spacer layer 16 is formed.

In order to improve the stress of the interface layer, the SCT is applied. In concrete, the SCT is the process of applying weak energy (specifically, RF plasma, ion beam, heat and the like) to at least part of the free layer 18.

After the SCT is applied, part of the rest of the NiFe layer (for example, NiFe of 1.5 nm) is deposited on the CoFe layer. Then, the SCT is applied to control the stress of the free layer 18.

Subsequently, as the rest of the NiFe layer, NiFe of 2 nm is deposited. Subsequently, by applying the SCT, the tensile stress of the free layer 18 is controlled. In the case of this example, three SCTs were performed.

By applying the SCT, tensile stress of the free layer is reduced, and more stable magnetoresistive effect element can be manufactured. By a kind of energy treatment called SCT, crystallinity of the free layer 18 is enhanced, and the stress is reduced.

By the SCT, crystallinity of the free layer 18 is improved. Namely, by inputting energy, at least any of film density, orientation, and grain size of the free layer 18 is improved. In the film where the crystallinity is improved, the stress is returned to the compressive side, and a large tensile stress is reduced.

When Ar ion beam, or RF plasma of Ar is irradiated as the SCT, Ar ion is implanted into the free layer 18, and thereby, scarce film density is improved. By improvement of the density of the film, the stress is returned to the compressive side, and the tensile stress is improved.

In this case, Ar is implanted into the part to which the SCT is applied (stress controlled part 21), and therefore, the part has a high possibility of containing more Ar than the other layers. More specifically, the stress controlled part 21 contains not less than twice as much Ar as the layer to which the SCT is not applied in some cases. For example, in the case of a bottom type spin-valve film, as compared with the pinned layer 14 disposed at the lower side of the spacer layer 16, the part of the free layer 18, to which the SCT is applied (the stress controlled part 21), has not less than twice as high Ar content in some cases. This state (difference in Ar content) can be analyzed by composition analysis in combination with cross-sectional transmission electron microphotograph, depth profile for analyzing a film composition while performing milling from a film surface by SIMS (Secondary Ion Mass Spectrum), a three-dimensional atom probe microscope and the like.

When ion and plasma of other gases are used instead of Ar, there is a high possibility of distribution occurring to the content of the gas component.

In this example, SCT was performed for the free layer 18 three times. The frequency of SCT is changeable as necessary, and about one to four times are preferable. Depending on the conditions, SCT may be performed only once.

The film thickness of the magnetic layer formed between the SCTs is preferably about 1 to 2 nm. In this case, the first SCT was performed after formation of the interface CoFe Layer, but this is not essential. For example, after formation of CoFe, after formation of part or all of the NiFe layer, SCT may be performed. For example, when the free layer 18 of CoFe [1 nm]/NiFe [3.5 nm] is desired to be formed ultimately, CoFe is deposited to 1 nm, and NiFe is deposited to 2.5 nm, after which, SCT is performed. An extremely small amount of NiFe of 0.4 nm is lost by SCT due to an etching effect, and therefore, the rest of NiFe of 1.4 nm is deposited in consideration of the difference. When the SCT treatment is not performed after NiFe deposition, SCT treatment is performed only once.

When occasion demands, SCT may be further performed after deposition of NiFe. In this case, it is conceivable that with an extremely small amount of etching by SCT is included from the beginning, and 0.4 nm is added at the time of the second NiFe deposition to deposit NiFe to 1.8 nm instead of deposition of 1.4 nm.

SCT includes two kinds of treatments, which are treatment by ion beam and RF plasma, and heating treatment, and the former is rather preferable. This is because the former is capable of controlling the treatment range. Namely, in the treatment by ion beam and RF plasma, by selection of the treatment conditions, only the film surface can be treated, so that the layer under it is not treated. On the other hand, in the heating treatment, control of the treatment range is difficult. By heating treatment, there is the possibility that diffusion or the like occurs to the interface of the stacked film under the spacer layer 16, and the characteristics of the spin-valve film deteriorate.

On the occasion of SCT, care should be taken not to have adverse effect on the spacer layer 16 directly below the free layer 18. SCT under the strong conditions causes reduction in adhesive force of the insulating layer 161 and the current path 162 in the spacer layer 16, and disturbance in the interfaces among the spacer layer 16, the upper metal layer 17 and the free layer 18, decrease in the MR ratio, degradation of reliability and the like.

After formation of the free layer 18 to which SCT is applied, the cap layer 19 is formed, and deposition of the spin-valve film is finished.

In order to exhibit the function as the pinned layer 14 sufficiently, and in order to improve crystallinity of the film, heating treatment is performed, and microprocessing for element production is performed.

(2) SCT During Deposition

SCT during deposition will be described.

Figure 6:
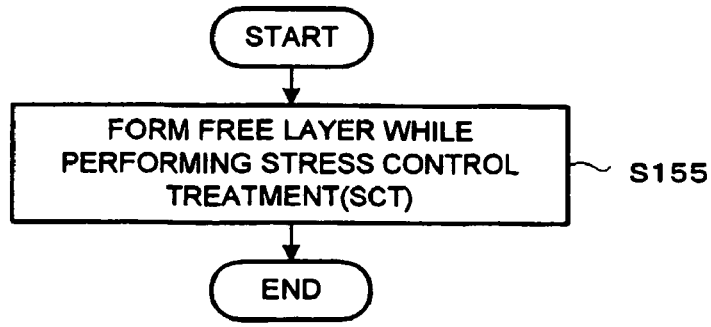
FIG. 6 is a flow chart showing an example of the details of step S15 in FIG. 3.

FIG. 6 shows a flow chart showing an example of the detail of step S15 in FIG. 3, and showing an example of the SCT during deposition. Here, stress control is performed while the free layer 18 is deposited.

At this time, as the SCT, for example, bias sputtering, substrate heating deposition and the like are cited.

In the bias sputtering, DC bias or RF bias is applied at the time of deposition of the free layer 18 onto the spacer layer 16. As the result, the internal stress of the free layer 18 is shifted to the compressive side from the tensile side.

Bias of 30 V to 200 V in DC bias, and bias of 30 W to 200 W in RF bias are applied to the substrate at the time of deposition of CoFe and NiFe layers as the free layer 18.

When the substrate is heated at the time of deposition, the temperature range of 100° C. to 300° C. is preferable. When the temperature is too low, there is the fear that the effect of the SCT is insufficient. When the temperature is too high, there is the fear of occurrence of diffusion to the interface of the metal stacked layer film of the lower layer of the spacer layer 16.

Here, it is conceivable that the intensity of the SCT to the free layer 18 at the time of deposition is made low at the beginning of deposition, and is made higher as the deposition advances (for example, the magnitude of the bias voltage is made low at the beginning (also including the case without application of voltage), and is made higher thereafter). This is for reducing the adverse effect on the spacer layer 16 and the like.

B. Details of the Treatment Conditions by Ion, Plasma and Heating as the SCT

As described above, during formation or after formation of the free layer 18, treatment by ion beam, RF plasma or heating is performed. The details of ion treatment, plasma treatment and heating treatment conditions as the SCT will be described hereinafter.

(1) Ion/Plasma Treatment

As one example of the SCT process, ion beam of a rare gas, or plasma is irradiated. As the rare gas, Ar, Xe, Kr, He, Ne and the like are cited, but Ar is desirable in respect of manufacture cost. A peculiar effect can be sometimes obtained by using Xe or the like larger in mass as necessary instead of Ar.

Ion Beam Treatment

Ion beam treatment means to make ion beam incident on the object to be treated by using an ion gun or the like. Gas is ionized in the ion gun, and is accelerated by voltage (acceleration voltage), whereby ion beam is emitted from the ion gun. For this ionization, ICP (inductive charge coupled) plasma or the like is used. In this case, a plasma amount is controlled by RF power or the like, an irradiated ion amount to a sample is controlled by the beam current amount. The energy of the ion beam treatment is controlled in accordance with the acceleration voltage value.

The irradiation conditions of the ion beam in the SCT process are preferably set so that an acceleration voltage V+ is 30 to 150 V, a beam current Ib is 20 to 200 mA, and RF power is 10 to 300 W. The RF power is the power which excites plasma with ion source to keep the beam current constant. These conditions are significantly easy as compared with the conditions of the case where ion beam etching is performed. The conspicuous etching in the SCT process has a possibility of causing loss of the composing materials (for example, CoFe and NiFe) of the free layer 18.

Here, by producing the element with an allowance for the thickness to be etched as the following (a) and (b), it is conceivable to perform SCT under severer conditions than the above description.

(a) With an allowance for the thickness to be etched of, for example, 2 nm or more, the second metal layer is deposited to be thicker than a desired thickness.

(b) Ion beam treatment is performed under severer conditions than the above description, and the second metal layer having the desired thickness with part of it etched is left.

However, the phenomenon such as film surface roughness due to etching occurs, and therefore, ion treatment under severe conditions is not so preferable.

In the SCT under the above described conditions, the typical value of film thickness reduction is 0 to 0.5 nm, which is an extremely small amount, which differs from normal etching for device production. The film thickness of about 0 to 0.5 nm which is an extremely small amount by which the magnetic layer decreases by SCT is properly corrected. For example, it is supplemented by extra deposition in the deposition thereafter, or it is deposited to be thicker by 0 to 0.5 nm in advance before SCT.

The incident angle of ion beam is defined as 0 degrees when it is incident perpendicular to the film place, and as 90 degrees when it is incident parallel with the film plane, and is properly changed in the range of 0 to 80 degrees. The treatment time by the SCT process is preferably about 15 seconds to 180 seconds, and is more preferably 30 seconds or more from the viewpoint of controllability or the like. If the treatment time is too long, it is not preferable since productivity of the CCP-CPP element reduces. From these viewpoints, the treatment time is preferably about 30 seconds to 180 seconds.

Plasma Treatment

Plasma treatment means to cause plasma to be incident on an object to be treated by using a plasma gun or the like. A gas such as Ar, Xe, and Kr is made into plasma by RF power and irradiated to the sample surface. The current amount and energy are controlled in accordance with the value of RF power. Intensity of RF plasma treatment is determined in accordance with the value of RF power. Here, the acceleration voltage and the beam current are determined by the RF power and it is difficult to control the current and energy independently as ion beam.

The energy range, time and the like are the same even if RF plasma is used instead of ion beam, and it is desirable to set the acceleration voltage V+ at 30 to 150 V, the beam current Ib at 20 to 200 mA, and the RF power (excites plasma with an ion source to keep the beam current constant) at 10 to 300 W. In order to perform SCT in weak energy in which etching does not occur, 10 to 100 W is a more preferable value as the value of the RF power. As the value of RF power, 10 to 50 W is favorable in controllability because it is weak power, and is further preferable.

In the case of RF plasma, the treatment time is preferably about 15 seconds to 180 seconds, and is more preferably 30 seconds or more from the viewpoint of controllability and the like. When the treatment time is too long, it is not preferable because productivity of the CCP-CPP elements reduces. From these viewpoints, the treatment time is the most preferably 30 seconds to 180 seconds. These condition ranges are the same as in the case of the ion beam.

Since ion beam and RF plasma have their own merits and demerits as follows, they can be optionally used properly in accordance with the situation. Namely, the RF plasma method is excellent in maintainability, and is suitable for mass production. On the other hand, RF plasma is inferior in controllability to ion beam. When in RF plasma, one of the parameters of acceleration voltage, RF power and current is set, the other parameters are automatically determined, and these parameters are not controllable independently from one another.

Bias Sputtering Treatment

Bias sputtering treatment means to apply voltage (bias voltage) of DC or RF to the substrate during deposition by sputtering, and may be considered as a kind of plasma treatment.

In sputtering, electric discharge is caused in the vicinity of a target of a deposition material, ion generating from the discharge is caused to be incident on the target, and the deposition material is scattered, whereby a film is formed on the substrate. When the bias voltage is applied to the substrate, plasma of electric discharge is attracted to the substrate, and incident on the substrate (incidence of plasma on the object to be treated). Namely, in the bias sputtering, deposition onto the substrate and incidence of plasma are performed in parallel. When bias sputtering is used as the SCT treatment, it is not necessary to repeatedly perform deposition and SCT treatment as described above, and therefore, it is excellent in throughput. The condition of bias at this time is preferably 30 to 200 V in the case of DC bias, and about 30 to 200 W in the case of RF bias.

(2) Heating Treatment

Instead of ion beam, and RF plasma, it is possible to perform SCT by heating treatment. In this case, 200° C. to 400° C. is preferable as the temperature range, and 250° C. to 300° C. is more preferable. If the temperature is lower than the temperature range, the effect as SCT decreases. If the temperature is higher than the temperature range, atoms diffuse in the lower layer in the spin-valve film, and there is the fear of having an adverse effect on it. As the time for heating treatment, about 10 seconds to 180 seconds are preferable, and 15 seconds to 60 seconds are more preferable.

As the heating method, heating by a lamp, substrate heating treatment by a heater placed at a substrate holder and the like are cited. In addition to these heating treatment method, Rapid Thermal Annealing treatment and the like can be cited.

The rapid thermal annealing treatment is a method of performing high-temperature thermal treatment only instantly, and is the treatment from not more than 1 second to about 60 seconds at the longest. For example, infrared ray is irradiated for a short time by using a lamp with high brightness, and thereby, rapid thermal annealing treatment can be realized.

In the rapid heating treatment, temperature can be rapidly raised and lowered, and therefore, reduction in the treatment time (for example, 60 seconds at the longest, normally within 10 seconds) is made possible. Thereby, a higher temperature range (for example, 200 to 400° C.) can be utilized. Namely, in the rapid heating treatment, treatment is performed at a relatively high temperature for a short time, whereby it is possible to exert the effect as SCT by high temperature, and to prevent diffusion in the interface of the lower layer of the spacer layer 16 by short-time treatment.

By applying SCT by ion beam, RF plasma, or heating to the magnetic layer on the spacer layer 16, an unfavorable crystallinity state and incomplete state of the magnetic layer on the spacer layer 16 are remedied, and tensile stress can be reduced.

The spot to which SCT is applied may be any one of the surface when part of the free layer 18 is deposited, the uppermost layer surface when all the free layer 18 is deposited, and both of them. More specifically, SCT is applied after the CoFe layer, which is the interface material of the free layer 18, is deposited, and after NiFe is further deposited, SCT can be performed. Treatment may be performed for only the surface of NiFe.

Further, in the treatment of the entire free layer 18, it is sometimes effective to perform SCT a plurality of times. For example, in the NiFe film, SCT is performed after NiFe is deposited to about 1 nm, and SCT is performed after the next deposition of 1 nm, and SCT is further performed after the final NiFe layer is deposited. This is the treatment considering, the relationship of the treatment depth in SCT and the film thickness of the free layer 18. Since SCT is performed with weak energy to avoid an adverse effect on etching and the other layers, the treatment range is from the surface to a depth within about 1 nm, and it is difficult to perform treatment to a depth of about several nm from the surface. On the other hand, the total film thickness of the free layer 18 is about 3 to 5 nm in most cases. Therefore, by performing SCT of 1 to 2 nm a plurality of times, the entire free layer 18 of 3 to 5 nm is treated.

In this case, as the free layer 18, the typical CoFe/NiFe stacked layer structure is cited as an example and described, but the film composition other than this may be adopted. For example, when the free layer 18 has the magnetic layer including at least one element of Co, Fe and Ni, SCT can be applied.

C. Apparatus Used for Manufacturing the Magnetoresistive Effect Element

Figure 7:
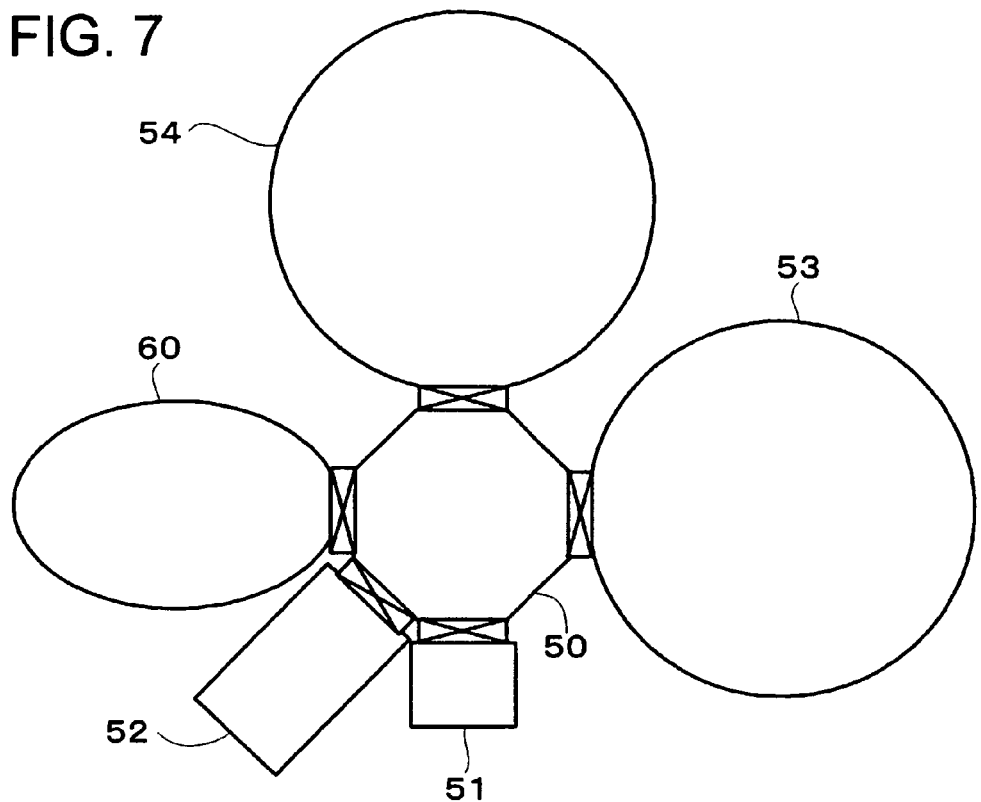
FIG. 7 is a schematic view showing an outline of a deposition apparatus used for manufacturing the magnetoresistive effect element.
Figure 8:
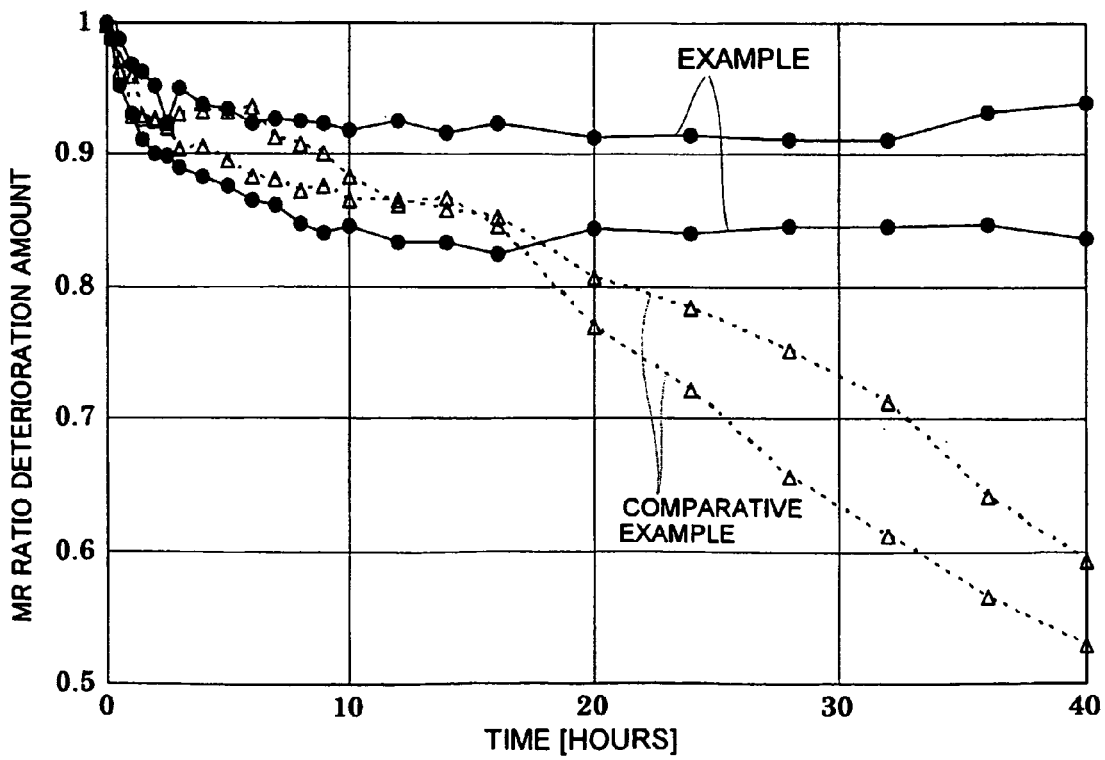
FIG. 8 is a graph showing the results of reliability test in an example in which SCT was performed and an comparative example in which SCT was not performed.

FIG. 7 is a schematic view showing an outline of a deposition apparatus used for manufacture of a magnetoresistive effect element. FIG. 8 is a schematic view showing an oxide layer/nitride layer forming chamber 60 in the deposition apparatus.

As shown in FIG. 7, with a transfer chamber (TC) 50 as a center, a load lock chamber 51, a pre-cleaning chamber 52, a first metal layer deposition chamber (MC1) 53, a second metal deposition chamber (MC2) 54, and an oxide layer/nitride layer forming chamber (OC) 60 are provided via gate valves, respectively. In this deposition apparatus, a substrate can be transferred in a vacuum between the respective chambers connected via the gate valves, and therefore, the surface of the substrate can be kept clean.

The metal deposition chambers 53 and 54 have multiple (quintuple to decuple) targets. As the deposition method, sputtering methods such as DC magnetron sputtering and RF magnetron sputtering, an ion beam sputtering method, a vapor deposition method, a CVD (Chemical Vapor Deposition) method, an MBE (Molecular Beam Epitaxy) method and the like are cited.

For SCT, a chamber having an RF plasma mechanism, an ion beam mechanism or a heating mechanism can be used. More specifically, the metal deposition chambers 53 and 54 having the RF bias mechanisms, the pre-cleaning chamber 52, and the like are suitable. The RF plasma mechanism is a relatively simple mechanism, and is easily installed into the metal deposition chambers 53 and 54. Both metal film deposition and SCT can be carried out by the metal deposition chambers 53 and 54.

SCT in the oxygen layer/nitrogen layer forming chamber 60 is not preferable. On the occasion of SCT in the oxydizing chamber, an oxygen gas, which is absorbed into the chamber, is desorbed, and enters the free layer 18, thus causing the fear of deterioration of the free layer 18. In the chamber which does not use oxygen during deposition as the metal deposition chambers 53 and 54, less oxygen is absorbed into the chamber, and quality of vacuum is easily kept favorable.

The typical value of a vacuum degree of the above described vacuum chamber is in the $10^{-9}$ Torr range, and the value of the first half of $10^{-8}$ Torr can be allowed.

D. General Description of Manufacturing Method of Magnetoresistive Effect Element Hereinafter, all of the manufacturing method of the magnetoresistive effect element will be described in detail.

The lower electrode 11, the underlayer 12, the pining layer 13, the pinned layer 14, the lower metal layer 15, the spacer layer 16, the upper metal layer 17, the free layer 18, the cap layer 19 and the upper electrode 20 are formed in sequence on a substrate (not shown).

The substrate is set at the load lock chamber 51, deposition of the metal is performed in the metal deposition chambers 53 and 54, and oxidation is performed in the oxide layer/nitride layer forming chamber 60, respectively. The ultimate pressure of the metal deposition chamber is preferably set at $1 \times 10^{-8}$ Torr or less, and is generally about $5 \times 10^{-10}$ Torr to $5 \times 10^{-9}$ Torr. The ultimate pressure of the transfer chamber 50 is on the order of $10^{-9}$ Torr. The ultimate pressure of the oxide layer/nitride layer forming chamber 60 is $8 \times 10^{-8}$ Torr or less.

(1) Formation of the Underlayer 12 (Step S11)

The lower electrode 11 is formed on a substrate (not shown) in advance by microfabrication process.

For example, Ta [5 nm]/Ru [2 nm] is formed on the lower electrode 11 as the underlayer 12. As is already described, Ta is the buffer layer 12a for relieving roughness of the lower electrode. Ru is the seed layer 12b which controls the crystal orientation and crystal grain size of the spin-valve film to be deposited thereon.

(2) Formation of the Pinning Layer 13 (Step S12)

The pinning layer 13 is deposited on the underlayer 12. As the material of the pinning layer 13, anti-ferromagnetic materials such as PtMn, PdPtMn, IrMn, and RuRhMn can be used.

(3) Formation of the Pinned Layer 14 (Step S13)

The pinned layer 14 is formed on the pinning layer 13. The pinned layer 14 can be a synthetic pinned layer composed of, for example, the lower pinned layer 141 ($Co_{90}Fe_{10}$), the magnetic coupling layer 142 (Ru) and the upper pinned layer 143 ($CO_{90}Fe_{10}$ [4 nm]).

(4) Formation of the Spacer Layer 16 (Step S14)

Next, the spacer layer (CCP-NOL) 16 having a current-confined-path structure (CCP structure) is formed. In order to form the spacer layer 16, the oxide layer/nitride layer forming chamber 60 is used.

In order to form the spacer layer 16, the following method is used. Here, the example of the case where the spacer layer 16 including the current path 162, which has a metal crystal structure and is composed of Cu, in the insulating layer 161, which has an amorphous structure and is composed of $Al_2O_3$, is formed will be described as an example.

1) After the lower metal layer 15 (for example, Cu) which is to be a supply source of the current path is deposited on the upper pinned layer 143, the metal layer to be oxidized (for example, AlCu and Al) which is converted into the insulating layer 161 is deposited on the lower metal layer 15.

Pre-treatment is performed by irradiating ion beam of a rare gas (for example, Ar) to the metal layer to be oxidized. The pre-treatment is called PIT (Pre-ion treatment). As a result of PIT, part of the lower metal layer is in the state in which it is sucked up and enters the metal layer to be oxidized. It is important to perform energy treatment as PIT after deposition of the second metal layer like this.

At the point of time of deposition, the first metal layer (the lower metal layer 15: Cu layer) exists in the state of the two-dimensional film. By the PIT process, Cu of the first metal layer is sucked up and enters the AlCu layer. The Cu, which enters the AlCu layer, is kept in the metal state even after the later oxidation treatment is performed, and becomes the current path 162. The PIT treatment is important treatment for realizing the current-confined-path structure (CCP) with high Cu purity.

In this process, Ar ion is irradiated under the conditions of acceleration voltage of 30 to 150 V, beam current of 20 to 200 mA, and treatment time of 30 to 180 seconds. In the above described acceleration voltage, the voltage range of 40 to 60 V is preferable. In the case of the voltage range higher than this, reduction in the MR ratio sometimes occurs due to influence such as surface roughness after PIT. The range of 30 to 80 mA as the current value, and the range of 60 seconds to 150 seconds as the irradiation time can be used.

Instead of the PIT treatment, there is the method of forming the metal layer before converted into the insulating layer 161 of AlCu, Al or the like by bias sputtering. In this case, energy of the bias sputtering can be set at 30 to 200 V in the case of DC bias, and at 30 to 200 W in the case of RF bias.

2) Next, the metal layer to be oxidized is oxidized by supplying an oxidizing gas (for example, oxygen), and the insulating layer 161 is formed. At this time, the conditions are selected so that the current path 162 is not directly oxidized. By the oxidation, the metal layer to be oxidized is converted into the insulating layer 161 composed of $Al_2O_3$, and the current path 162 which penetrates through the insulating layer 161 is formed, whereby the spacer layer 16 is formed.

For example, By supplying an oxidizing gas (for example, oxygen) while irradiating the ion beam of a rare gas (Ar, Xe, Kr, He, or the like), the metal layer to be oxidized is oxidized (Ion beam-assisted oxidation (IAO: Ion beam-assisted Oxidation)). By the oxidation treatment, the spacer layer 16 having the insulating layer 161 composed of $Al_2O_3$ and the current path 162 composed of Cu is formed. This is the treatment utilizing the difference in the oxidation energy, that is, Al is easy to oxidize and Cu is difficult to oxidize.

In this process, Ar ion is irradiated under the conditions of the acceleration voltage of 40 to 200 V, the beam current of 30 to 200 mA, and the treatment time of 15 to 300 seconds while oxygen is supplied. In the above described acceleration voltage, the voltage range of 50 to 100 V is preferable. If the acceleration voltage is higher than this, there is the possibility of occurrence of reduction in the MR ratio due to the influence of surface roughness or the like after PIT. 40 to 100 mA as the beam current, and 30 seconds to 180 seconds as the irradiation time can be adopted.

As the oxygen supply amount at the oxidation time in IAO, 2000 to 4000 L is a preferable range. If not only Al but also the lower magnetic layer (pinned layer 14) is oxidized during IAO, heat resistance and reliability of the CCP-CPP element are reduced, which is not preferable. In order to enhance reliability, it is important that the magnetic layer (pinned layer 14) located below the spacer layer 16 is not oxidized and is in the metal state. In order to realize this, the oxygen supply amount needs to be set within the above described range.

In order to form a stable oxide by the supplied oxygen, it is desirable to flow an oxygen gas only while ion beam is irradiated to the substrate surface. Namely, it is desirable not to flow the oxygen gas when the ion beam is not irradiated to the substrate surface.

The film thickness of the Cu layer of the lower metal layer 15 is controlled in accordance with the film thickness of the AlCu layer. Namely, if the film thickness of the AlCu layer is made thick, the Cu amount caused to enter the AlCu layer on the occasion of the PIT process has to be increased, and therefore, the film thickness of the Cu layer needs to be thick. For example, when the film thickness of AlCu is 0.6 to 0.8 nm, the film thickness of the Cu layer is made about 0.1 to 0.5 nm. When the film thickness of AlCu is 0.8 to 1 mm, the film thickness of the Cu layer is made about 0.3 to 1 nm. If the Cu layer is too thin, a sufficient amount of Cu is not supplied to the AlCu layer during the PIT process, and therefore, it is difficult to penetrate the current path 162 of Cu up to the upper portion of the AlCu layer. As a result of this, the area resistance RA becomes excessively high, and the MR ratio becomes an insufficient value.

If the Cu layer of the lower metal layer 15 is too thick on the other hand, on the occasion of the PIT process, a sufficient amount of Cu is supplied into the AlCu layer, but there is the possibility that a thick Cu layer remains between the pinned layer 14 and the spacer layer 16. In order to obtain a high MR ratio in the CCP-CPP element, the current confined in the spacer layer 16 needs to reach the magnetic layer (the pinned layer 14 or the free layer 18) while it is kept confined. If a thick Cu layer remains between the pinned layer 14 and the spacer layer 16, the current confined in the spacer layer 16 spreads until it reaches the pinned layer 14, and causes reduction in the MR ratio. As the film thickness of Cu which finally remains after completion of the magnetoresistive effect element, 1 nm or less is preferable. This is because, with the film thickness more than this, the current confinement effect is lost, and effect of increasing the MR ratio is lost. The film thickness of Cu which finally remains is more preferably 0.6 nm or less.

As the material of the first metal layer (lower metal layer 15) which forms the current path, Au, Ag and the like may be used instead of Cu. However, as compared with Au and Ag, Cu is higher in stability against the heating treatment, and is preferable. As the material of the first metal layer, magnetic materials may be used instead of these non-magnetic materials. As the magnetic materials, Co, Fe, Ni, and alloys of them can be cited.

When the magnetic material used for the pinned layer 14, and the magnetic material used for the current path 162 are the same, the supply source of the current path 162 (first metal layer) does not have to be deposited on the pinned layer 14. Namely, after the second metal layer which is converted into the insulating layer 161 is deposited on the pinned layer 14, the material of the pinned layer 14 is caused to enter the second metal layer by performing PIT process, and the current path 162 composed of the magnetic material can be formed.

By using $Al_{90}Cu_{10}$ for the second metal layer, not only Cu of the first metal layer is sucked up but also Cu in AlCu is separated from Al, in the PIT process. Namely, the current path 162 is formed from both the first and the second metal layers. When ion-beam assisted oxidation is performed after the PIT process, oxidation advances while separation of Al and Cu is promoted by the assist effect by ion beam.

As the second metal layer, Al single metal which does not include Cu that is the composing material of the current path 162 may be used instead of $Al_{90}Cu_{10}$. In this case, Cu which is the composing material of the current path 162 is supplied only from the first metal layer. When AlCu is used as the second metal layer, Cu, which is the material of the current path 162, is also supplied from the second metal layer during the PIT process. Therefore, when the thick insulating layer 161 is formed, the current path 162 can be formed relatively easily. When Al is used as the second metal layer, Cu hardly enters $Al_2O_3$ formed by oxidation, and therefore, $Al_2O_3$ with high withstand voltage is easily formed. Since Al and AlCu have their own merits, they can be properly used in accordance with the situation.

The film thickness of the second metal layer is 0.6 to 2 nm in the case of AlCu, and about 0.5 to 1.7 nm in the case of Al. The film thickness of the insulating layer 161 formed by these second metal layers being oxidized becomes about 0.8 to 3.5 nm. The insulating layer 161 with the film thickness after oxidation in the range of about 1.3 to 2.5 nm is easily produced, and is advantageous in the respect of the current confining effect. The diameter of the current path 162 which penetrates through the insulating layer 161 is about 1 to 10 nm, and is preferably about 2 to 6 nm. The metal path 162 larger than 10 nm in diameter causes variation in characteristic of each element when it is formed in a smaller size, and is not preferable, and it is preferable that the metal path 162 larger than 6 nm in diameter does not exist.

AlCu as the second metal layer is preferably has the composition expressed by $Al_xCu_{100-x}$ (x=100 to 70%). An element such as Ti, Hf, Zr, Nb, Mg, Mo, or Si may be added to AlCu. In this case, the composition of the additive element is preferably about 2 to 30%. If these elements are added, formation of the CCP structure is likely to be facilitated. If these additive elements are distributed more richly in the border region of the insulating layer 161 of $Al_2O_3$ and the current path 162 of Cu than in the other regions, adhesiveness of the insulating layer 161 and the current path 162 is enhanced, and there is the possibility of enhancing electro-migration resistance. In the CCP-CPP element, the density of the current flowing into the metal path of the spacer layer 16 becomes a huge value of $10^7$ to $10^{10}$ $A/cm^2$. Therefore, it is important that the electro-migration resistance is high and stability of the Cu current path 162 at the time of passage of a current can be ensured. However, if a proper CCP structure is formed, sufficiently favorable electro-migration resistance can be realized without adding an element to the second metal layer.

The material of the second metal layer is not limited to an Al alloy for forming $Al_2O_3$, but may be an alloy with Hf, Mg, Zr, Ti, Ta, Mo, W, Nb, Si or the like as a main component. The insulating layer 161 which is converted from the second metal layer is not limited to an oxide, but may be a nitride and an oxynitride.

In the case of using any material as the second metal layer, the film thickness at the time of deposition is preferably 0.5 to 2 nm, and the film thickness when it is converted into an oxide, a nitride or an oxynitride is preferably about 0.8 to 3.5 nm.

The insulating layer 161 is not limited to oxides respectively including single elements, but may be oxides, nitrides and oxynitrides of alloy materials. For example, an oxide or the like of a material containing 0 to 50% of any one element of Ti, Mg, Zr, Ta, Mo, W, Nb, Si and the like with $Al_2O_3$ as a base material, or 0 to 50% of a plurality of elements in Al can be used.

(5) Formation of the Upper Metal Layer 17 and the Free Layer 18 (Step S15)

For example, Cu [0.25 nm] is deposited on the spacer layer 16 as the upper metal layer 17. The preferable film thickness range is about 0.2 to 0.6 nm. Use of film thickness of about 0.4 nm provides a merit of easily enhancing crystallinity of the free layer 18. It is effective to perform SCT for the magnetic layer on the spacer layer, but in some instances, extremely weak SCT is applied to the surface of the upper metal layer 17.

The free layer 18, for example, $Co_{90}Fe_{10}$ [1 nm]/$Ni_{83}Fe_{17}$ [3.5 nm] is formed on the upper metal layer 17. Since it is the layer on the spacer layer, SCT is performed for this layer.

First, in order to obtain a high MR ratio, selection of the magnetic material of the free layer 18 located in the interface with the spacer layer 16 is important. In this case, it is more preferable to provide a CoFe alloy in the interface with the spacer layer 16 than an NiFe alloy. $CO_{90}Fe_{10}$ [1 nm] which is especially stable in soft magnetic properties among CoFe alloys can be used. The CoFe alloys with the other compositions can be used.

When a CoFe alloy in the vicinity of $Co_{90}Fe_{10}$ is used, the film thickness is preferably set at 0.5 to 4 nm. When a CoFe alloy of another composition (for example, $CO_{50}Fe_{50}$) is used, the film thickness is preferably set at 0.5 to 2 nm. When, for example, $Fe_{50}Co_{50}$ (or $Fe_xCo_{100-x}$ (x=45 to 85)) is used for the free layer 18 to increase the spin-dependent interface scattering effect, it is difficult to use a large film thickness as the pinned layer 14 to keep soft magnetism as the free layer 18. Therefore, the preferable film thickness range is 0.5 to 1 nm. When Fe which does not include Co is used, relatively favorable soft magnetism properties are provided, and therefore, the film thickness can be set at about 0.5 to 4 nm.

The NiFe layer which is provided on the CoFe layer is composed of a material stable in soft magnetism properties. The soft magnetism properties of the CoFe alloy is not so stable, but the soft magnetism properties can be complemented by providing an NiFe alloy thereon. Use of NiFe as the free layer 18 makes it possible to use the material capable of realizing a high MR ratio in the interface with the spacer layer 16, and is preferable for the total characteristics of the spin-valve film.

The composition of the NiFe alloy is preferably $Ni_xFe_{100-x}$ (x=about 78 to 85%). In this case, it is preferable to use a composition richer in Ni (for example, $Ni_{83}Fe_{17}$) than the composition $Ni_{81}Fe_{19}$ of NiFe which is usually used. This is for realizing zero magnetostriction. In the NiFe deposited on the spacer layer 16 of the CCP structure, magnetostriction is shifted to the positive side more than in the NiFe deposited on the spacer layer of metal Cu. In order to cancel out the shift of magnetostriction to the positive side, the NiFe composition to the negative side having more Ni composition than usual is used.

The total film thickness of the NiFe layer is preferably about 2 to 5 nm (for example, 3.5 nm). When the NiFe layer is not used, the free layer 18 in which a plurality of CoFe layers or Fe layers each of 1 to 2 nm, and extremely thin Cu layers each of about 0.1 to 0.8 nm are alternately stacked may be used.

It is an important point of this embodiment to perform SCT for the composing materials of the free layer 18 as described above. As described above, for example, the CoFe layer and the NiFe layer are treated with ion, plasma or heat.

As an concrete example, after CoFe is deposited to 1 nm, NiFe is deposited to 2.5 nm, and as the SCT, RF plasma treatment of 10 to 100 W is performed for 60 seconds to 120 seconds. Thereafter, NiFe is deposited to 2 nm, and as the SCT, RF plasma treatment of 10 to 100 W is performed for 60 seconds to 120 seconds.

(6) Formation of the Cap Layer 19 and the Upper Electrode 20 (Step S16)

For example, Cu [1 nm]/Ru [10 nm] is stacked on the free layer 18 as the cap layer 19. The upper electrode 20 to pass a current perpendicularly to the spin-valve film is formed on the cap layer 19.

EXAMPLE

Hereinafter, an example of the present invention will be described. The composition of the magnetoresistive effect film 10 according to the example of the present invention will be shown.

The lower electrode 11
The underlayer 12: Ta [5 nm]/Ru [2 nm]
The pinning layer 13: $Pt_{50}Mn_{50}$ [15 nm]
The pinned layer 14: $Co_{90}Fe_{10}$ [3.6 nm]/Ru [0.9 nm]/ ($Fe_{50}Co_{50}$ [1 nm]/Cu [0.25 nm])×2/$Fe_{50}CO_{50}$ [1 nm]
The metal layer 15: Cu [0.5 nm]
The spacer layer (CCP-NOL) 16: the insulating layer 161 of $Al_2O_3$ and the current path 162 of Cu (after depositing $Al_{90}Cu_{10}$ [1 nm], PIT/IAO treatment)
The metal layer 17: Cu [0.25 nm]
The free layer 18: $Co_{90}Fe_{10}$ [1 nm]/$Ni_{83}Fe_{17}$ [0.7 nm]/ SCT/$Ni_{83}Fe_{17}$ [1.8 nm]/SCT/$Ni_{83}Fe_{17}$ [1.8 nm]/SCT
The cap layer 19: Cu [1 nm]/Ru [10 nm]
The upper electrode 20

The manufacture process of the free layer 18 will be described. The other processes are performed with the methods already described, and the explanation of them will be omitted.

$Co_{90}Fe_{10}$ of 1 nm was deposited, $Ni_{83}Fe_{17}$ of 0.7 nm was deposited thereon, and the first SCT was applied to the surface of it. In this case, RF plasma treatment was used as SCT. In the metal deposition chamber with the RF bias mechanism, the first RF plasma treatment with an Ar flow rate of 40 sccm, RF power of 20 W, bias voltage of 80 V for 120 seconds was performed. By the RF plasma treatment, NiFe of 0.2 nm was cut, and the NiFe of 0.5 nm practically remained as a film.

Here, the RF plasma treatment was applied to the surface on which NiFe was deposited to 0.7 nm, but the RF plasma treatment may be applied to the surface after CoFe deposition. However, CoFe was 1 nm and thin, and therefore, if the RF plasma treatment was too strong, there was the possibility that the interface of the spacer layer 16 and the metal layer 17 was damaged, and the MR ratio was reduced. In consideration of easiness of control, the RF plasma treatment was performed after NiFe was deposited to 0.7 nm in this case. For the same reason, the RF power was made weaker than the later second and third RF plasma treatments.

After the RF plasma treatment, $Ni_{83}Fe_{17}$ of 2.0 nm was deposited, and thereafter, the RF plasma treatment was performed. The second RF plasma treatment with an Ar flow rate of 40 sccm, RF power of 40 W, bias voltage of 110 V for 120 seconds was performed. By this RF plasma treatment, NiFe of 0.5 nm was cut, and NiFe of 2.0 nm practically remained as a film.

After the second RF plasma treatment, $Ni_{83}Fe_{17}$ of 2.0 nm was deposited, and the third RF plasma treatment with an Ar flow rate of 40 sccm, RF power of 40 W for 120 seconds was performed. By this RF plasma treatment, NiFe of 0.5 nm was cut, and NiFe of 3.5 nm practically remained as a film.

As mentioned above, the magnetic layer (free layer 18) to which SCT is applied, more specifically, CoFe [1 nm]/NiFe [3.5 nm] was formed.

Evaluation of the Example

The example was evaluated with a comparative example. The example and comparative example are both elements each of 0.4 μM×0.4 μm produced by using the free layer 18 of the stacked structure of CoFe [1 nm]/NiFe [3.5 nm]. In the example, SCT was applied to the free layer 18, while in the comparative example, SCT was not applied to the free layer 18x and the free layer 18x was kept as was deposited.

When the characteristics of the CCP-CPP element according to the example were evaluated, RA=500 mΩμm$^2$, MR ratio=9%, ΔRA=45 mΩμm$^2$. As compared with the element without SCT, a large change did not occur to the RA, and the value of MR ratio, but reliability at the time of reliability test is remarkably enhanced.

FIG. 8 is a graph showing the results of the reliability tests in the example with SCT performed, and the comparative example without performing SCT. The horizontal axis represents stress time, and the vertical axis represents the normalized deterioration amount of the MR ratio. Namely, the deterioration amount of the MR ratio is normalized with the value at the time of start of the test as 1.

The conditions of the reliability test were the temperature of 130° C., and the bias voltage of 140 mV. By establishing the severer conditions than the usual use conditions, difference in reliability is caused to appear in the short-term test. The direction in which the current flows was from the pinned layer 14 to the free layer 18. Namely, as the flow of electrons is in the reverse direction, and therefore, electrons flow from the free layer 18 to the pinned layer 14. Such a current direction is a desirable direction to reduce a spin transfer noise. When a current is passed from the free layer 18 to the pinned layer 14 (as the flow of electrons, from the pinned layer to the free layer), spin transfer torque effect is said to be larger, which causes larger noise in the head than the opposite current direction. From this point of view, the current direction is preferably the direction in which a current flows from the pinned layer to the free layer.

In the test conditions in this case, the temperature was set to be higher than the normal condition because of the acceleration test. Because of the size of the element, the bias voltage was also in the relatively strong condition. In the example, the element size was made larger than the element size in the actual head (actually, in an element size smaller than 0.1 μm×0.1 μm). If the element size is large, the current amount becomes large even with the same bias voltage, and heat release performance of the element becomes low. Therefore, the element of the example was tested under the severe conditions in which an influence of Joule heating was much larger than the element of the actual head. Further, the bias voltage was larger than the voltage value actually used, the temperature condition was higher than actually, and all the conditions were set to be severe, which was the acceleration test conditions set to determine the degree of reliability in a short time.

As shown in FIG. 8, in the example using the SCT, reliability is remarkably improved as compared with the case of the comparative example. If the conditions of the acceleration test are relaxed, the deterioration amount also becomes far smaller, and high reliability is provided even in the comparative example. Therefore, the test was performed under the extremely harsh conditions.

High reliability of the element of the example in such severe conditions means that the magnetoresistive effect element according to this embodiment can be used under the environment demanding high reliability. In the head adaptable to high-density recording, the head with far higher reliability than before can be realized. The head adaptable to high-density recording can be used in HDDs (Hard Disk Drive) with the reliability specifications in the severe use conditions for application to, for example, a car navigation system used under a high-heat environment, and a server used at a high speed, and for application to enterprise and the like.

In this test, the current passing direction was the direction in which the current flowed to the free layer 18 from the pinned layer 14, and this current passing direction provided a larger effect of improvement of reliability than the reverse current passing direction from this. This is also an advantageous current passing direction in reduction of spin transfer noise, and therefore, a head with higher reliability with low noise can be realized.

Second Embodiment

Figure 9:
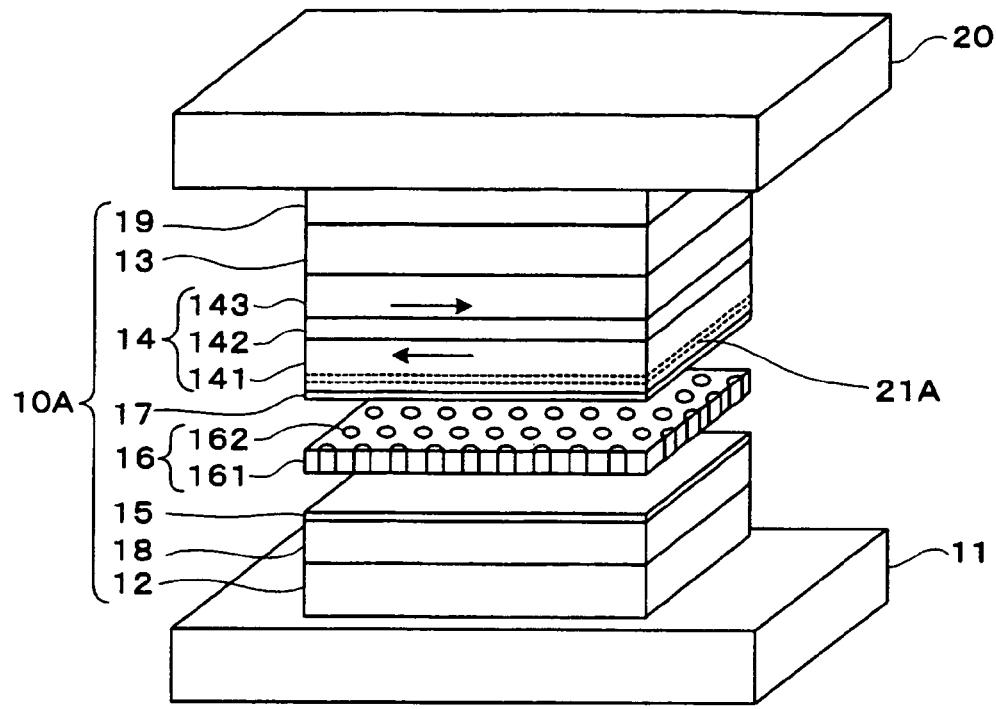
FIG. 9 is a perspective view showing a magnetoresistive effect element according to a second embodiment.
Figure 10:
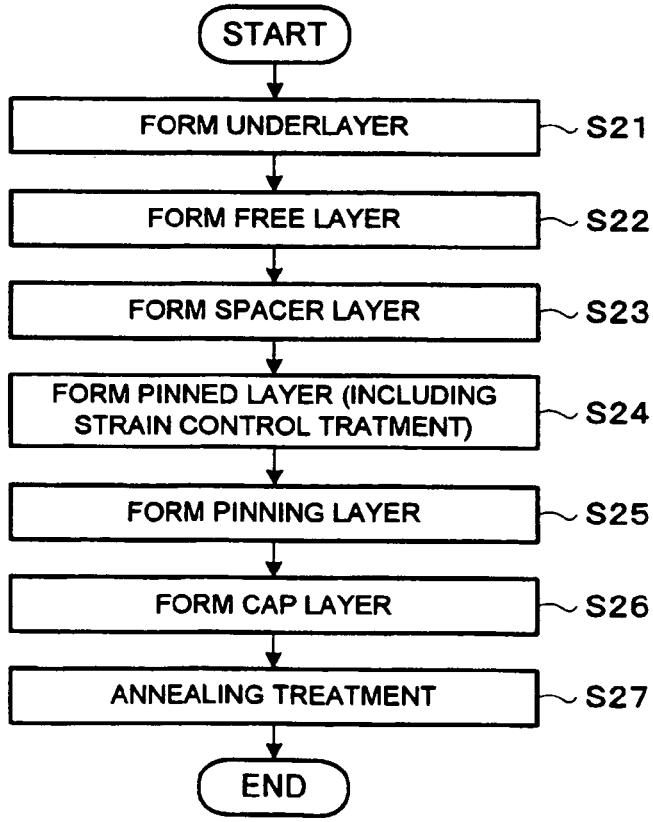
FIG. 10 is a flow chart showing a manufacture process of the magnetoresistive effect element according to the second embodiment.

FIG. 9 is a perspective view showing a magnetoresistive effect element (CCP-CPP element) according to a second embodiment of the present invention. FIG. 10 is a flow chart showing a manufacture process of the magnetoresistive effect element according to the second embodiment of the present invention. The magnetoresistive effect element is a top type CCP-CPP element in which the pinned layer 14 is disposed above the free layer 18. Namely, SCT can be applied to not only a bottom type CCP-CPP element in which the pinned layer 14 is located below the free layer 18, but also to a top type CCP-CPP element.

In the case of a top-type spin-valve film, the layer requiring SCT is not the free layer 18 but the pinned layer 14. Since the crystal orientation of the magnetic layer which grows on the spacer layer 16 degrades, SCT to the magnetic film is required. In FIG. 9, the lower pinned layer 141 has a stress control part 21A.

The pinned layer 14 is composed of the lower pinned layer 141, the magnetic coupling layer 142, and the upper pinned layer 143, and SCT to any one or two layers of them, or all these three layers is possible. Even if the SCT is limited to part of the pinned layer 14, reliability of the element can be enhanced by reduction in internal stress. The layer which provides the highest effectiveness of the SCT of these three layers is considered to be the lower pinned layer 141. The lower pinned layer 141 is the closest to the spacer layer 16, and has a large effect on stress in the border with the spacer layer 16.

As the bottom type, in the top type CCP-CPP element, the treatment by ion, plasma or heat can be properly adopted as SCT. The treatment by plasma includes formation of the pinned layer 14 by bias sputtering. When the pinned layer 14 is composed of an FeCo/Cu stacked film, for example, an FeCo layer composed of a bcc structure is deposited to 1 to 2 nm, after which, SCT is performed, and the sequence of performing SCT of 1 to 2 nm is repeated twice to three times. When occasion demands, it is possible to complete the treatment by performing SCT only once.

As shown in FIG. 10, when the top type of CCP-CPP element is manufactured, the layers between the underlayer 12 and the cap layer 19 are deposited in the substantially inversed order from FIG. 3. However, the order of the lower metal layer 15 and the upper metal layer 17 is not inversed in relation with production of the spacer layer 16 and the like. The internal composition of the pinned layer 14 is not vertically inversed.

In the top type CCP-CPP element, the functions of the lower metal layer 15 and the upper metal layer 17 (Cu layer) on and under the spacer layer 16 are the same as in the bottom type CCP-CPP element. Namely, the lower metal layer 15 (Cu layer) under the spacer layer 16 is the supply source of the current path 162, and therefore, is essential, but the upper metal layer 17 (Cu layer) on the spacer layer 16 is not essential.

(Application of Magnetoresistive Effect Element)

Hereinafter, application of the magnetoresistive effect element (CCP-CPP element) according to the embodiments will be described.

In the embodiments, the element resistance RA of the CPP element is preferably 500 mΩμm$^2$ or less, and is more preferably 300 mΩμm$^2$ or less, from the viewpoint of adaptation to high density. When the element resistance RA is calculated, the resistance R of the CPP element is multiplied by the effective area A of the current passing portion of the spin-valve film. Here, the element resistance R can be directly measured. On the other hand, the effective area A of the current passing portion of the spin-valve film has the value dependent on the element structure, and therefore, care should be taken in determination of it.

For example, when the entire spin-valve film is patterned as the area which effectively performs sensing, the area of the entire spin-valve film is the effective area A. In this case, from the viewpoint of properly setting the element resistance, the area of the spin-valve film is set to be at least 0.04 μm$^2$ or less, and at the recording density of 200 Gbpsi or more, it is set at 0.02 μm$^2$ or less.

However, when the lower electrode 11 or the upper electrode 20 which has a smaller area than the spin-valve film is formed in contact with the spin-valve film, the area of the lower electrode 11 or the upper electrode 20 becomes the effective area A of the spin-valve film. When the areas of the lower electrode 11 and the upper electrode 20 differ, the area of the smaller electrode is the effective area A of the spin-valve film. In this case, from the viewpoint of properly setting the element resistance, the area of the smaller electrode is set to be at least 0.04 μm$^2$ or less.

Figure 11:
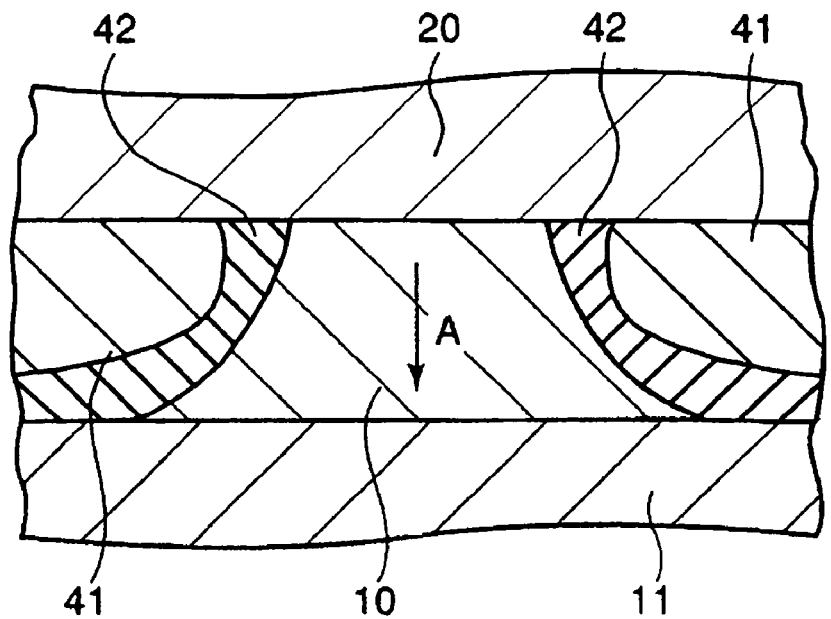
FIG. 11 is a view showing a state in which the magnetoresistive effect element according to the embodiment into a magnetic head.
Figure 12:
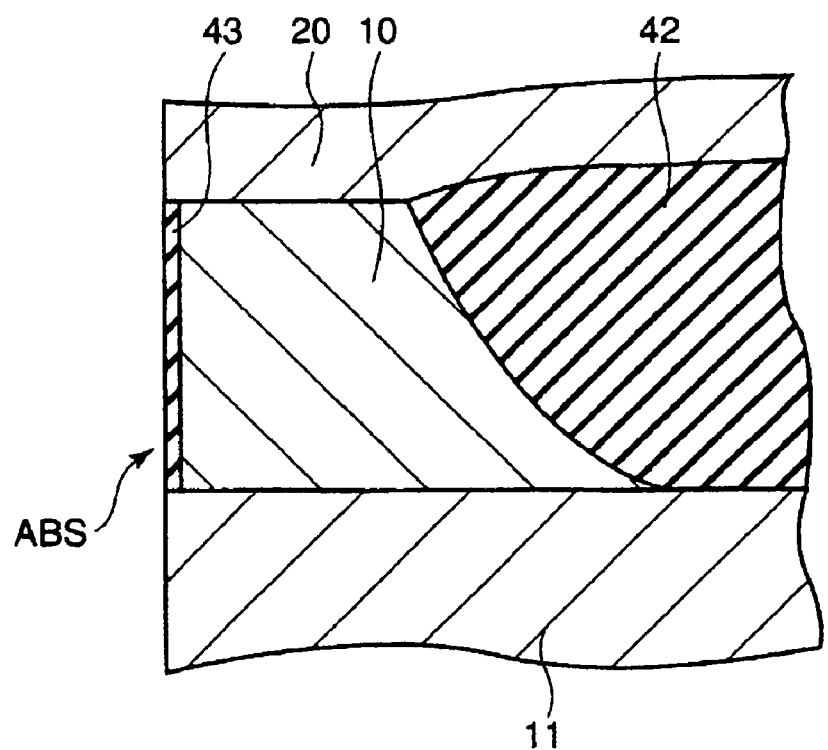
FIG. 12 is a view showing a state in which the magnetoresistive effect element according to the embodiment into a magnetic head.

In the case of the example shown in FIGS. 11 and 12 which will be described in detail later, the smallest area of the spin-valve film 10 in FIG. 11 is the portion in contact with the upper electrode 20, and therefore, its width is considered as the track width Tw. Concerning the height direction, the portion in contact with the upper electrode 20 in FIG. 12 is the smallest, and therefore, the width of it is considered as the height length D. The effective area A of the spin-valve film is considered to be A=Tw×D.

In the magnetoresistive effect element according to the embodiment of the present invention, the resistance R between the electrodes can be set at 100Ω or less. The resistance R is the resistance value which is measured between the two electrode pads of the reproducing head part fitted to a tip end of, for example, a head gimbal assembly (HGA).

In the magnetoresistive effect element according to the embodiments, when the pinned layer 14 or the free layer 18 is of the fcc structure, it is desired to have fcc (111) orientation. When the pinned layer 14 or the free layer 18 has the bcc structure, it is desired to have bcc (110) orientation. When the pinned layer 14 or the free layer 18 has the hcp structure, it is desired to have hcp (001) orientation or hcp (110) orientation.

The crystal orientation of the magnetoresistive effect element according to the embodiments is preferably within 4.0 degrees in variation angle of orientation, is more preferably within 3.5 degrees, and is far more preferably within 3.0 degrees. This is obtained as a half value width of the rocking curve at the peak position obtained by θ-2θ measurement of X-ray diffraction. This can be detected as the dispersion angle at the spot in the nano-diffraction spot from the element section.

Though it depends on the material of the antiferromagnetic film, an antiferromagnetic film and the pinned layer 14/spacer layer 16/free layer 18 generally differ in lattice spacing, and the variation angles of orientation in the respective layers can be separately calculated. For example, platinum manganese (PtMn) and the pinned layer 14/spacer layer 16/free layer 18 differ in lattice spacing in many cases. Platinum manganese (PtMn) is a relatively thick film, and therefore, is a suitable material for measurement of variation in crystal orientation. The pinned layer 14/spacer layer 16/free layer 18 sometimes differ such that the pinned layer 14 and the free layer 18 have the crystal structures of the bcc structure and the fcc structure. In this case, the pinned layer 14 and the free layer 18 have the distribution angles of different crystal orientations, respectively.

(Magnetic Head)

FIG. 11 and FIG. 12 show a state in which the magnetoresistive effect element according to the embodiments is incorporated into a magnetic head. FIG. 11 is a sectional view of the magnetoresistive effect element cut in the direction substantially parallel with a medium opposing surface opposed to a magnetic recording medium (not shown). FIG. 12 is a sectional view of the magnetoresistive effect element cut in the direction perpendicular to a medium opposing surface ABS.

The magnetic head shown as an example in FIGS. 11 and 12 has a so-called hard abutted structure. The magnetoresistive effect film 10 is the above described CCP-CPP film. The lower electrode 11 and the upper electrode 20 are respectively provided under and on the magnetoresistive effect film 10. In FIG. 11, on both side surfaces of the magnetoresistive effect film 10, a bias magnetic field-applying film 41 and an insulating film 42 are stacked and provided. As shown in FIG. 12, a protection layer 43 is provided on the medium opposing surface of the magnetoresistive effect film 10.

A sense current to the magnetoresistive effect film 10 is passed in the direction substantially perpendicular to the film plane as shown by the arrow A by the lower electrode 11 and the upper electrode 20 disposed under and on it. A bias magnetic field is applied to the magnetoresistive effect film 10 by a pair of bias magnetic field-applying films 41 and 41 provided at the left and the right. By controlling magnetic anisotropy of the free layer 18 of the magnetoresistive effect film 10 to make it a single magnetic domain by the bias magnetic field, the magnetic domain structure is stabilized and Barkhausen noise accompanying displacement of the magnetic domain wall can be controlled.

The S/N ratio of the magnetoresistive effect film 10 is enhanced, and therefore, when applied to a magnetic head, magnetic reproducing with high sensitivity is possible.

(Hard Disk and Head Gimbal Assembly)

The magnetic head shown in FIGS. 11 and 12 can be loaded on a magnetic recording/reproducing apparatus by being incorporated into a recording/reproducing integrated type magnetic head assembly.

Figure 13:
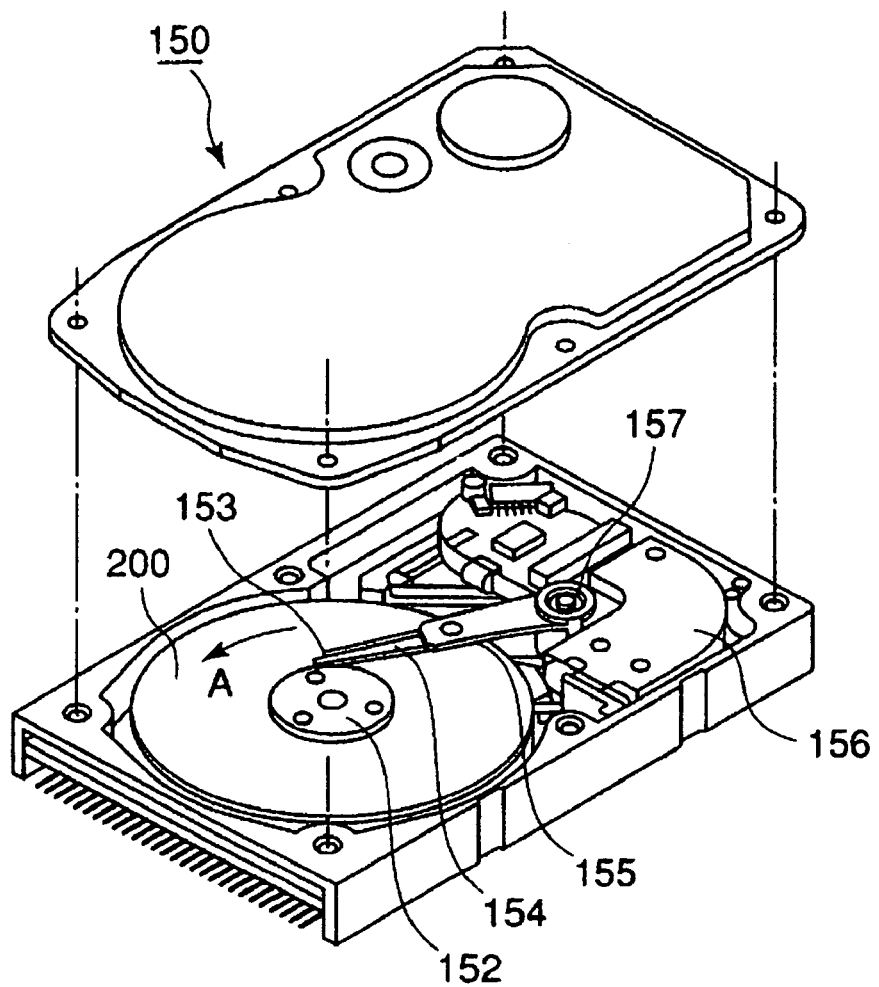
FIG. 13 is a perspective view of a substantial part, which shows a schematic construction of a magnetic recording/reproducing apparatus as an example.

FIG. 13 is a perspective view of a main part showing a schematic construction of such a magnetic recording/reproducing apparatus. Namely, a magnetic recording/reproducing apparatus 150 of this embodiment is a device of a type using a rotary actuator. In the drawing, a magnetic disk 200 is fitted to a spindle 152, and is rotated in the direction of the arrow A by a motor not shown which responds to a control signal from the drive device control part not shown. The magnetic recording/reproducing apparatus 150 of this embodiment may include a plurality of magnetic disks 200.

A head slider 153 which performs recording/reproducing of information stored in the magnetic disk 200 is mounted to a tip end of a suspension 154 in a thin film shape. The head slider 153 is loaded with a magnetic head including the magnetoresistive effect element according to any of the above described embodiments in the vicinity of its tip end.

When the magnetic disk 200 rotates, the medium-facing surface (ABS) of the head slider 153 is held with a predetermined floating amount from the surface of the magnetic disk 200. Alternatively, a so-called "contact-traveling type" in which the slider is in contact with the magnetic disk 200 may be adopted.

The suspension 154 is connected to one end of an actuator arm 155. A voice coil motor 156 which is a kind of a linear motor is provided at the other end of the actuator arm 155. The voice coil motor 156 is constructed by a drive coil not shown wounded on a bobbin part, and a magnetic circuit constituted of a permanent magnet and a counter yoke disposed to oppose to each other to sandwich the coil.

The actuator arm 155 is held by ball bearings not shown which are provided at two upper and lower spots of a spindle 157 so as to be able to rotate and slide by the voice coil motor 156.

Figure 14:
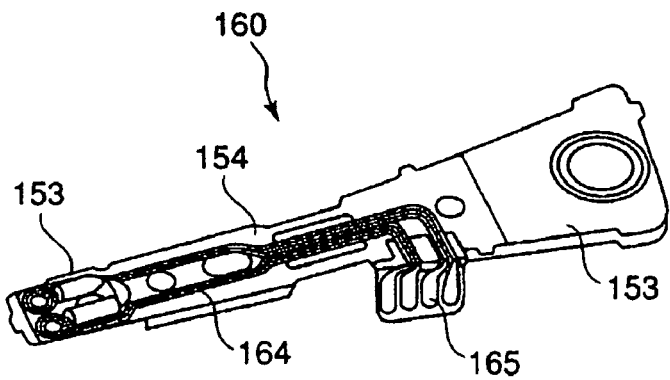
FIG. 14 is an enlarged perspective view of a head gimbal assembly at a tip end from an actuator arm seen from a disk side.

FIG. 14 is an enlarged perspective view of a head gimbal assembly at the tip end from the actuator arm 155 seen from the disk side. Namely, an assembly 160 has the actuator arm 155, and the suspension 154 is connected to one end of the actuator arm 155. The head slider 153 including the magnetic head including the magnetoresistive effect element according to any one of the above described embodiments is mounted to the tip end of the suspension 154. The suspension 154 has a lead wire 164 for writing and reading a signal, and the lead wire 164 and each electrode of the magnetic head incorporated into the head slider 153 are electrically connected. Reference numeral 165 in the drawing denotes an electrode pad of the assembly 160.

According to the present embodiments, by including the magnetic head including the above described magnetoresistive effect element, information magnetically recorded in the magnetic disk 200 with high recording density can be reliably read.

(Magnetic Memory)

Next, a magnetic memory loaded with the magnetoresistive effect element according to the embodiment will be described. Namely, by using the magnetoresistive effect element according to the embodiments, a magnetic memory such as a magnetic random access memory (MRAM) in which memory cells are disposed in a matrix shape can be realized, for example.

Figure 15:
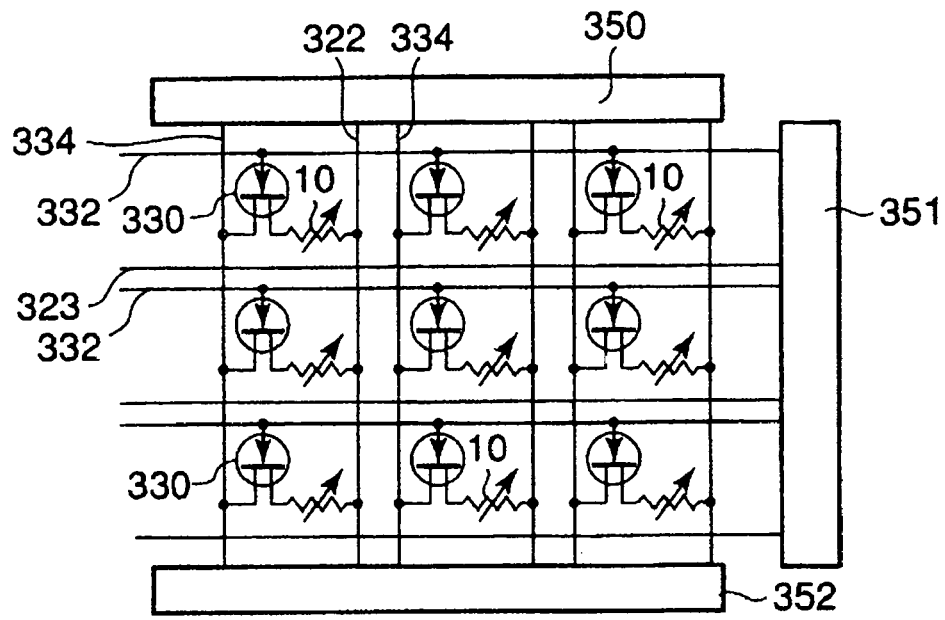
FIG. 15 is a view showing an example of a matrix configuration of a magnetic memory according to the embodiment.

FIG. 15 is a view showing one example of a matrix configuration of the magnetic memory according to the embodiments. FIG. 15 shows a circuit configuration when memory cells are disposed in an array shape. In order to select 1 bit in the array, a column decoder 350 and a row decoder 351 are included, a switching transistor 330 is turned on by a bit line 334 and a word line 332 and the one bit is uniquely selected, and by detecting it with the sense amplifier 352, the bit information recorded in the magnetic recording layer (free layer) in the magnetoresistive effect film 10 can be read. When the bit information is written, a write current is passed to the specific write word line 323 and bit line 322, and the generated magnetic field is applied.

Figure 16:
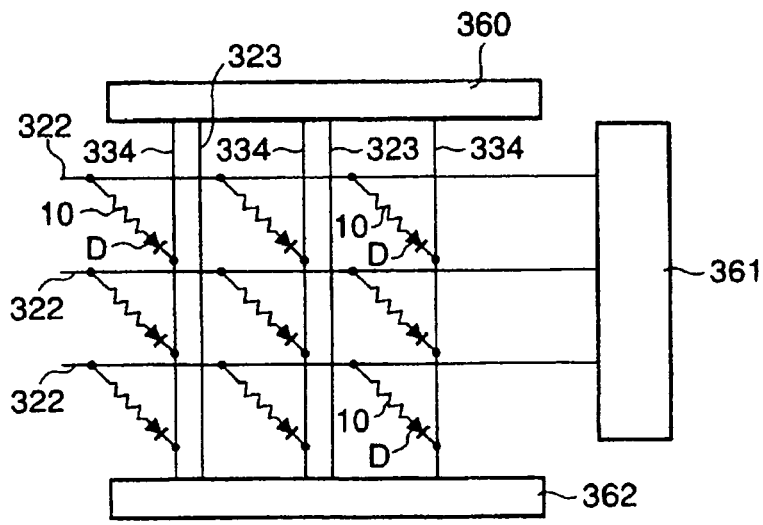
FIG. 16 is a view showing another example of the matrix configuration of the magnetic memory according to the embodiment.

FIG. 16 is a view showing another matrix configuration of the magnetic memory according to the embodiments. In this case, the bit line 322 and the word line 334 which are arranged in a matrix shape are respectively selected by the decoders 360 and 361, and the specific memory cell in the array is selected. Each memory cell has the structure in which the magnetoresistive effect element 10 and a diode D are connected in series. Here, the diode D has the function of preventing a sense current from making a detour in the selected memory cell other than the magnetoresistive effect element 10. Write is performed by the magnetic field generated by passing a write current to the specific bit line 322 and write word line 323, respectively.

Figure 17:
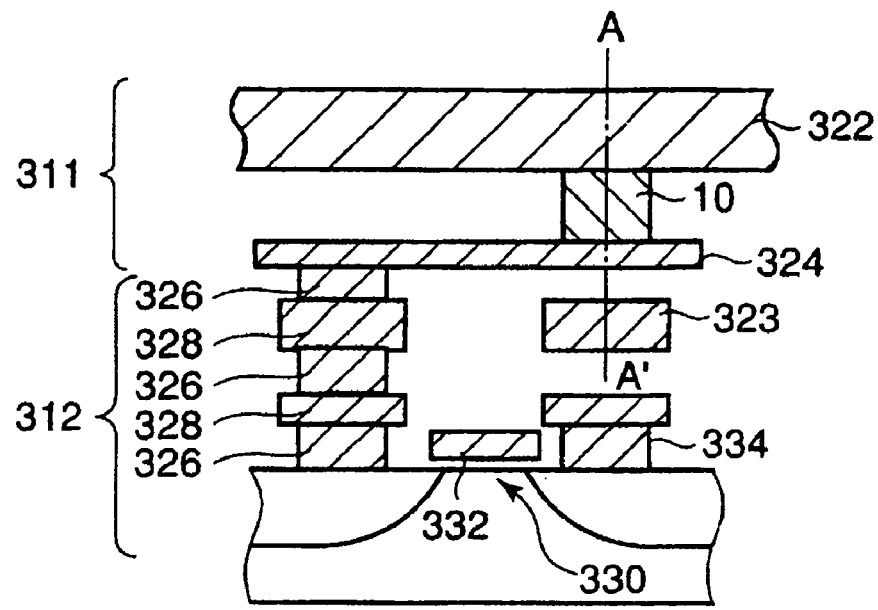
FIG. 17 is a sectional view showing a substantial part of the magnetic memory according to the embodiments.
Figure 18:
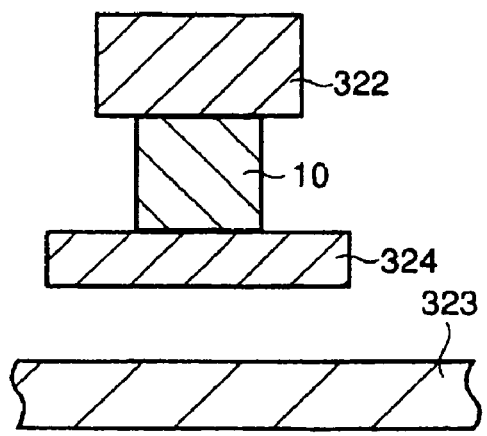
FIG. 18 is a sectional view taken along the A-A' line in FIG. 17.

FIG. 17 is a sectional view showing a main part of a magnetic memory according to the embodiment. FIG. 18 is a sectional view taken along the A-A' line of FIG. 17. The structure shown in these drawings corresponds to the memory cell of 1 bit included in the magnetic memory shown in FIG. 15 or FIG. 16. The memory cell has a memory element part 311 and an address selecting transistor part 312.

The memory element part 311 has the magnetoresistive effect element 10, and a pair of wirings 322 and 324 connected to this. The magnetoresistive effect element 10 is the magnetoresistive effect element (CCP-CPP element) according to the above described embodiments.

Meanwhile, the address selecting transistor part 312 is provided with a transistor 330 connected via a via 326 and a buried wiring 328. The transistor 330 performs a switching operation in accordance with the voltage applied to a gate 332, and controls opening and closing of a current path of the magnetoresistive effect element 10 and a wiring 334.

Below the magnetoresistive effect element 10, the write wiring 323 is provided in the direction substantially perpendicular to the wiring 322. These write wirings 322 and 323 can be formed by, for example, aluminum (Al), copper (Cu), tungsten (W), tantalum (Ta) or an alloy including any one of them.

In the memory cell with such a composition, when the bit information is written into the magnetoresistive effect element 10, a write pulse current is passed to the wirings 322 and 323, and by applying the synthetic magnetic field induced by the currents, magnetization of the recording layer of the magnetoresistive effect element is properly inverted.

When the bit information is read out, a sense current is passed through the wiring 322, the magnetoresistive effect element 10 including the magnetic recording layer, and a lower electrode 324, and the resistance value or the change in the resistance value of the magneto-resistive effect element 10 is measured.

The magnetic memory according to the embodiments reliably controls the magnetic domain of the recording layer and can ensure reliable write and can reliably perform reading by using the magnetoresistive effect element (CCP-CPP element) according to the above described embodiments, even if the cell size is miniaturized.

In use in MRAM, the example as follows is available.

Ta [5 nm]/Ru [2 nm]/PtMn [15 nm]/CoFe [3.5 nm]/Ru [0.9 nm]/CoFeB [3.5 nm]/MgO [1.5 nm]/CoFe [1 nm]/NiFe [1 nm]/CCP structure of $Al_2O_3$—NiFe/NiFe [1 nm]/SCT/NiFe [1 nm].

In use in MRAM, it is proposed that the magnetoresistive effect is realized by a tunnel element, and the CCP structure is used for enhancing switching technique of MRAM, and the like (H. Meng and J-P. Wang, IEEE Trans Magn. 41 (10), 2612 (2005)). In this case, it is necessary to provide the CCP structure inside the free layer or the pinned layer, but if it is provided, among the free layer and the pinned layer formed on the CCP, crystallinity of the layer formed on the upper part of the CCP degrades, and the problem of variation of switching or the like is caused.

In this problem, SCT is performed at the time of deposition of NiFe which is formed on the CCP structure of $Al_2O_3$—NiFe, the stress of the free layer can be improved. In use in MRAM, it is possible to perform SCT for the magnetic layer deposited on the CCP inserted into the free layer like this. When the CCP is inserted into the free layer, it is preferable that the upper and lower magnetic layers are magnetically coupled strongly via the CCP, and therefore, for the metal to be the current path, it is preferable to use Ni, Co, Fe and alloy materials of them instead of Cu.

In this case, the above described PIT/IAO treatment is preferably performed as the formation process for realizing the CCP structure inserted into the free layer. In this case, the material forming the current path includes a large amount of magnetic elements (includes 50% or more of anyone element of Fe, Co and Ni), and therefore, the lower metal layer 15 and the upper metal layer 17 are not especially required, and the material which forms the free layer 16 can be directly used.

Other Embodiments

The embodiment of the present invention is not limited to the above described embodiments, and can be enlarged and changed, and the enlarged and changed embodiments are included in the technical scope of the present invention.

With regard to the concrete structure of the magnetoresistive effect film, and the shapes and materials of the electrodes, bias applying film, insulating film and the like other than that, those skilled in the art can similarly carry out the present invention by properly selecting them from the known range and the similar effect can be obtained.

For example, on application of the magnetoresistive effect element to a reproducing magnetic head, detection resolution of the magnetic head can be specified by applying magnetic shields to the top and bottom of the element.

The embodiment of the present invention can be applied to magnetic heads or magnetic reproducing apparatuses of not only a longitudinal magnetic recording method, but also a vertical magnetic recording method.

Further, the magnetic reproducing apparatus of the present invention may be a so-called fixed type which steadily includes a specific recording medium, and may be a so-called "removable" type in which the recording medium is replaceable.

Moreover, all the magnetoresistive effect elements, magnetic heads, magnetic recording/reproducing apparatus and magnetic memories which can be carried out by those skilled in the art by properly changing the designs based on the magnetic head and the magnetic recording/reproducing apparatus described above as the embodiment of the present invention are also included in the scope of the present invention.

The invention claimed is:

1. A method of manufacturing a multilayer structure for a magnetoresistive effect element, comprising:
   forming a first magnetic layer;
   forming a spacer layer including an insulating layer and a conductive layer on the first magnetic layer, the conductive layer penetrating through the insulating layer and for passing an electrical current;
   forming a second magnetic layer, all of which or part of which is treated with ions, plasma or heat, on the spacer layer, the ions being accelerated with a voltage from 30V to 150V inclusive, a beam current being 20 mA to 200 mA inclusive, and RF power being 10 W to 300 W inclusive, the plasma being generated by applying a bias voltage from 30V to 200V inclusive, a beam current being 20 mA to 200 mA inclusive, and RF power being 10 W to 300 W inclusive, the heating being at a temperature from 200° C. to 400° C. inclusive and heating between 10 seconds to 180 seconds inclusive, the treatment reducing stress in the multilayer structure; and
   forming a cap layer directly on the second magnetic layer after the second magnetic layer is treated.

2. The method according to claim 1,
   wherein forming the second magnetic layer comprises:
      depositing the second magnetic layer; and
      treating at least part of the second magnetic layer with the ions, plasma or heat.

3. The method according to claim 1,
   wherein forming the second magnetic layer comprises:
      forming a first sublayer which is part of the second magnetic layer;
      treating the first sublayer with the ions, plasma or heat;
      forming a second sublayer which is part of the second magnetic layer on the first sublayer; and
      treating the second sublayer with the ions, plasma or heat.

4. The method according to claim 3,
   wherein forming the second magnetic layer further comprises:
      forming a third sublayer forming part of the second magnetic layer on the second sublayer; and
      treating the formed third sublayer with the ions, plasma or heat.

5. The method according to claim 3,
   wherein the thickness of each of the first sublayer and the second sublayer is from 0.5 nm to 3 nm inclusive.

6. The method according to claim 1,
   wherein forming the second magnetic layer includes depositing the second magnetic layer simultaneously with being treated with the ions, plasma or heat.

7. The method according to claim 6,
   wherein the second magnetic layer is treated with the heating, the heating being at a temperature from 100° C. to 300° C. inclusive.

8. The method according to claim 1,
   wherein the second magnetic layer is treated with the ions of a rare gas or plasma of the rare gas, the rare gas including any of Ar(argon), Kr(krypton), Xe(xenon) and Ne(neon).

9. The method according to claim 1, further comprising:
substantially fixing a magnetization direction of one of the first magnetic layer and the second magnetic layer after the second magnetic layer is treated.

10. The method according to claim 1,
wherein the second magnetic layer includes a CoFe sublayer and an NiFe sublayer, and at least part of the NiFe sublayer is treated.

11. The method according to claim 1,
wherein the second magnetic layer includes an FeCo sublayer of a body-centered cubic (bcc) structure, or a CoFe sublayer of a face-centered cubic (fcc) structure, and at least part of the FeCo sublayer or the CoFe sublayer is treated.

12. The method according to claim 1,
wherein forming the spacer layer includes:
   forming a third layer including a first metal material;
   forming a fourth layer including a second metal material different from the first metal material;
   treating a surface of the fourth layer with the ions or plasma; and
   treating the surface of the fourth layer with oxidizing, nitriding, or oxynitriding to form the spacer layer.

13. The method according to claim 12,
wherein the second magnetic layer is treated with the ions or plasma.

14. The method according to claim 1,
wherein the insulating layer includes an oxide, a nitride or an oxynitride of an element selected from Al(aluminum), Si(silicon), Hf(hafnium), Ti(titanium), Ta(tantalum), Mo(molybdenum), W(wolfram), Nb(niobium), Mg(magnesium), Cr(chromium) and Zr(zirconium).

15. The method according to claim 12,
wherein the third layer is a metal layer including any one element selected from Cu(copper), Au(gold) and Ag(silver).

16. The method according to claim 1, wherein the plasma is generated using a plasma gun.

17. The method according to claim 1, wherein the treatment improves the crystallinity of the second magnetic layer in order to reduce stress.

18. The method according to claim 1, wherein the conductive layer is arranged for passing electric current between the first magnetic layer and the second magnetic layer.

* * * * *